US007408964B2

(12) United States Patent
Johnson

(10) Patent No.: US 7,408,964 B2
(45) Date of Patent: *Aug. 5, 2008

(54) VERTICAL CAVITY SURFACE EMITTING LASER INCLUDING INDIUM AND NITROGEN IN THE ACTIVE REGION

(75) Inventor: Ralph H. Johnson, Murphy, TX (US)

(73) Assignee: Finisar Corporation, Sunnyvale, CA (US)

( * ) Notice: Subject to any disclaimer, the term of this patent is extended or adjusted under 35 U.S.C. 154(b) by 34 days.

This patent is subject to a terminal disclaimer.

(21) Appl. No.: 10/026,019

(22) Filed: Dec. 20, 2001

(65) Prior Publication Data

US 2003/0118068 A1 Jun. 26, 2003

(51) Int. Cl.
*H01S 5/00* (2006.01)
(52) U.S. Cl. .................... 372/43.01; 372/45.01
(58) Field of Classification Search ............... 372/43, 372/45, 46, 43.01
See application file for complete search history.

(56) References Cited

U.S. PATENT DOCUMENTS

| 4,445,218 | A | 4/1984 | Coldren |
| 4,608,697 | A | 8/1986 | Coldren |
| 4,622,672 | A | 11/1986 | Coldren et al. |
| 4,829,347 | A | 5/1989 | Cheng et al. |
| 4,873,696 | A | 10/1989 | Coldren et al. |
| 4,896,325 | A | 1/1990 | Coldren |
| 5,045,499 | A | 9/1991 | Nishizawa et al. |
| 5,082,799 | A | 1/1992 | Holmstrom et al. |
| 5,245,622 | A | 9/1993 | Jewell et al. |
| 5,251,225 | A * | 10/1993 | Eglash et al. ............ 372/45 |
| 5,293,392 | A | 3/1994 | Shieh et al. |
| 5,343,487 | A | 8/1994 | Scott et al. |
| 5,358,880 | A | 10/1994 | Lebby et al. |
| 5,365,540 | A | 11/1994 | Yamanaka |
| 5,383,211 | A * | 1/1995 | Van de Walle et al. ...... 372/43 |

(Continued)

FOREIGN PATENT DOCUMENTS

EP 0 740 377 A1 10/1996

(Continued)

OTHER PUBLICATIONS

Mayer and Lau, Electronic Material Science: For Integrated Circuits in Si and GaAs 1990, Macmillan Publishing company.*

(Continued)

*Primary Examiner*—Dung T Nguyen
(74) *Attorney, Agent, or Firm*—Workman Nydegger

(57) ABSTRACT

Quantum wells and associated barriers layers can be grown to include nitrogen (N), aluminum (Al), antimony (Sb), phosphorous (P) and/or indium (In) placed within or about a typical GaAs substrate to achieve long wavelength VCSEL performance, e.g., within the 1260 to 1650 nm range. In accordance with features of the present invention, a vertical cavity surface emitting laser (VCSEL) can include at least one quantum well comprised of InGaAsN; barrier layers sandwiching said at least one quantum well; and confinement layers sandwiching said barrier layers. Confinement and barrier layers can comprise AlGaAs, GaAsN. Barrier layers can also comprise InGaAsN. Quantum wells can also include Sb. Quantum wells can be developed up to and including 50 Å in thickness. Quantum wells can also be developed with a depth of at least 40 meV.

26 Claims, 22 Drawing Sheets

U.S. PATENT DOCUMENTS

| | | |
|---|---|---|
| 5,392,307 A | 2/1995 | Sugiyama et al. |
| 5,416,044 A | 5/1995 | Chino et al. |
| 5,422,901 A | 6/1995 | Lebby et al. |
| 5,468,343 A | 11/1995 | Kitano |
| 5,491,710 A | 2/1996 | Lo |
| 5,513,204 A | 4/1996 | Jayaraman |
| 5,568,504 A | 10/1996 | Kock et al. |
| 5,588,995 A | 12/1996 | Sheldon |
| 5,631,472 A | 5/1997 | Cunningham et al. |
| 5,693,180 A | 12/1997 | Furukawa et al. |
| 5,719,891 A | 2/1998 | Jewell |
| 5,719,894 A | 2/1998 | Jewell et al. |
| 5,719,895 A | 2/1998 | Jewell et al. |
| 5,729,567 A | 3/1998 | Nakagawa |
| 5,732,103 A | 3/1998 | Ramdani et al. |
| 5,747,366 A | 5/1998 | Brillouet et al. |
| 5,754,578 A | 5/1998 | Jayaraman |
| 5,757,833 A | 5/1998 | Arakawa et al. |
| 5,805,624 A | 9/1998 | Yang et al. |
| 5,809,051 A | 9/1998 | Oudar |
| 5,815,524 A | 9/1998 | Ramdani et al. |
| 5,818,862 A | 10/1998 | Salet |
| 5,825,796 A | 10/1998 | Jewell et al. |
| 5,835,521 A | 11/1998 | Ramdani et al. |
| 5,841,152 A * | 11/1998 | Ishikawa ................... 257/14 |
| 5,877,038 A | 3/1999 | Coldren et al. |
| 5,883,912 A | 3/1999 | Ramdani et al. |
| 5,898,722 A | 4/1999 | Ramdani et al. |
| 5,903,586 A | 5/1999 | Ramdani et al. |
| 5,912,913 A | 6/1999 | Kondow et al. |
| 5,943,357 A | 8/1999 | Lebby et al. |
| 5,943,359 A | 8/1999 | Ramdani et al. |
| 5,956,363 A | 9/1999 | Lebby et al. |
| 5,960,018 A | 9/1999 | Jewell et al. |
| 5,974,073 A | 10/1999 | Canard et al. |
| 5,978,398 A | 11/1999 | Ramdani et al. |
| 5,985,683 A | 11/1999 | Jewell |
| 5,991,326 A | 11/1999 | Yuen et al. |
| 6,002,705 A * | 12/1999 | Thornton ................... 372/96 |
| 6,021,147 A | 2/2000 | Jiang et al. |
| 6,046,065 A | 4/2000 | Goldstein et al. |
| 6,046,096 A * | 4/2000 | Ouchi ...................... 438/510 |
| 6,049,556 A | 4/2000 | Sato |
| 6,052,398 A | 4/2000 | Brillouet et al. |
| 6,057,560 A | 5/2000 | Uchida |
| 6,061,380 A | 5/2000 | Jiang et al. |
| 6,061,381 A | 5/2000 | Adams et al. |
| 6,121,068 A | 9/2000 | Ramdani et al. |
| 6,127,200 A | 10/2000 | Ohiso et al. |
| 6,148,016 A | 11/2000 | Hegblom et al. |
| 6,195,485 B1 | 2/2001 | Coldren et al. |
| 6,207,973 B1 | 3/2001 | Sato et al. |
| 6,252,894 B1 * | 6/2001 | Sasanuma et al. ............. 372/45 |
| 6,252,896 B1 | 6/2001 | Tan et al. |
| 6,314,118 B1 | 11/2001 | Jayaraman et al. |
| 6,341,137 B1 | 1/2002 | Jayaraman et al. |
| 6,359,920 B1 * | 3/2002 | Jewell et al. .................. 372/46 |
| 6,362,069 B1 | 3/2002 | Forrest et al. |
| 6,366,597 B1 | 4/2002 | Yuen et al. |
| 6,372,533 B2 | 4/2002 | Jayaraman et al. |
| 6,399,966 B1 * | 6/2002 | Tsuda et al. ................. 257/103 |
| 6,424,669 B1 | 7/2002 | Jiang et al. |
| 6,434,180 B1 | 8/2002 | Cunningham |
| 6,465,961 B1 * | 10/2002 | Cao ........................... 315/58 |
| 6,542,530 B1 | 4/2003 | Shieh et al. |
| 6,567,448 B1 * | 5/2003 | Sun et al. ................... 372/50.1 |
| 6,621,842 B1 * | 9/2003 | Dapkus ...................... 372/45 |
| 6,642,070 B2 * | 11/2003 | Jiang et al. ................... 438/22 |
| 6,798,809 B1 * | 9/2004 | Gambin et al. ........... 372/45.01 |
| 2002/0067748 A1 | 6/2002 | Coldren et al. |
| 2002/0071464 A1 | 6/2002 | Coldren et al. |
| 2002/0071471 A1 | 6/2002 | Kim et al. |
| 2002/0075920 A1 | 6/2002 | Spruytte et al. |
| 2002/0075929 A1 | 6/2002 | Cunningham |
| 2002/0090016 A1 | 7/2002 | Coldren et al. |
| 2002/0131462 A1 | 9/2002 | Line et al. |
| 2003/0053510 A1 | 3/2003 | Yuen et al. |
| 2003/0179792 A1 * | 9/2003 | Riechert et al. ............... 372/43 |
| 2006/0039432 A1 * | 2/2006 | Ha et al. .................. 372/45.012 |

FOREIGN PATENT DOCUMENTS

| | | |
|---|---|---|
| EP | 0 740 377 B | 10/1996 |
| EP | 0 765 014 A1 | 3/1997 |
| EP | 0 822 630 A1 | 2/1998 |
| EP | 0 874 428 A2 | 10/1998 |
| EP | 0 874 428 B1 | 10/1998 |
| EP | 0 874 428 A3 | 11/1998 |
| EP | 0 765 014 B1 | 7/1999 |
| EP | 0 975 073 A1 | 1/2000 |
| EP | 1182756 A | 2/2002 |
| EP | 1 294 063 A1 | 3/2003 |
| JP | 57026492 A | 2/1982 |
| RO | 332930 | 6/1997 |
| WO | WO 98/07218 A1 | 2/1998 |
| WO | 0896406 A | 2/1999 |
| WO | WO 00/52789 A2 | 2/2000 |
| WO | WO 00/52789 A3 | 2/2000 |
| WO | WO 00/33433 A2 | 6/2000 |
| WO | WO 00/33433 A3 | 6/2000 |
| WO | WO 00/38287 A1 | 6/2000 |
| WO | WO 00/65700 A2 | 11/2000 |
| WO | WO 00/65700 A3 | 11/2000 |
| WO | WO 01/16642 A2 | 3/2001 |
| WO | WO 01/16642 A3 | 3/2001 |
| WO | WO 01/17076 A2 | 3/2001 |
| WO | WO 01/17076 A3 | 3/2001 |
| WO | WO 01/18919 A1 | 3/2001 |
| WO | WO 01/24328 A2 | 4/2001 |
| WO | WO 01/24328 A3 | 4/2001 |
| WO | WO 01/33677 A2 | 5/2001 |
| WO | WO 01/33677 A3 | 5/2001 |
| WO | WO 01/52373 A2 * | 7/2001 |
| WO | WO 0152373 A | 7/2001 |
| WO | WO 01/84682 A2 | 11/2001 |
| WO | WO 01/93387 A2 | 12/2001 |
| WO | WO 01/93387 A3 | 12/2001 |
| WO | WO 01/95444 A2 | 12/2001 |
| WO | WO 01/98756 A2 | 12/2001 |
| WO | WO 02/03515 A2 | 1/2002 |
| WO | WO 02/17445 A1 | 2/2002 |
| WO | WO 02/084829 A1 | 10/2002 |

OTHER PUBLICATIONS

Electronics Material Science: For Integrated Circuits in Si and GaAs by James W. Mayer and S.S. Lau, Mcmillan Publishing Company.*

Almuneau, G., et al., "Accurate control of SB composition in AlGaAsSb alloys on InP substrates by molecular beam epitaxy", article, Journal of Crystal Growth, vol. 208, May 6, 1999, pp. 113-116.

Almuneau, G., et al., "Improved electrical and thermal properties of InP-AlGaAsSb Bragg mirrors for long-wavelength vertical-cavity lasers", article, IEEE Photonics Technology Letters, Vo. 12, No. 10, Oct. 2000, pp. 1322-1324.

Almuneau, G., et al., "Molecular beam epitaxial growth of monolithic 1.55 µm vertical cavity surface emitting lasers with AlGaAsSb/AlAsSb Bragg mirrors", article, Journal of Vacuum Science Technology, vol. 8, No. 3, May/Jun. 2000, pp. 1601-1604.

Black, K., et al. "Double-fused 1.5 µm vertical cavity lasers with record high $T_o$ of 132K at room temperature", article, Electronics Letters, vol. 34, No. 20, Oct. 01, 1998, pp. 1947-1949.

Blum, O., et al., "Electrical and optical characteristics of AlAsSb/BaAsSb distributed Bragg reflectors for surface emitting lasers", article, Applied Physics Letters, vol. 67, No. 22, Nov. 27, 1995, pp. 3233-3235.

Blum, O., et al., "Highly reflective, long wavelength AlAsSb/GaAsSb distributed Bragg reflector grown by molecular beam epitaxy on InP substrates", article, Applied Physics Letters, Vo. 66, No. 3, Jan. 16, 1995, pp. 329-331.

Boucart, J., et al., "1mW CE-RT monolithic VCSEL at 1.55 µm", article, IEEE Photonic Technology Letters, vol. 11, No. 6, Jun. 1999, pp. 629-631.

Campbell, J., et al., "Quantum dot resonant cavity photodiode with operation near 1.3 µm wavelength", article, Electronics Letters, vol. 33, No. 15, Jul. 17, 1997, pp. 1337-1339.

Chang, C., et al., "Parasitics and design considerations on oxide-implant VCSELs", article, IEEE Photonics Technology Letters, vol. 13, No. 12, Dec. 2001, pp. 1274-1276.

Choquette, K., et al., "Room temperature continuous wave InGaAsN quantum well vertical-cavity lasers emitting at 1.3 µm", article, Electronics Letters, vol. 36, No. 16, Aug. 3, 2000, pp. 1388-1390.

Dowd, P., et al., "Long wavelength (1.3 and 1.5 µm) photoluminescence from InGaAs/GaPAsSb quantum wells grown on GaAs", article, Applied Physics Letters, vol. 75, No. 9, Aug. 30, 1999, pp. 1267-1269.

Dudley, J., et al., "Water fused long wavelength vertical cavity lasers", conference proceedings, LEOS '93 Conference Proceedings, IEEE Lasers and Electro-Optics Society 1993 Annual Meeting, Nov. 15-18, 1993, pp. 560-561.

Gourley, F., et al., "Epitaxial semiconductor optical interference devices", invited paper, SPIE, vol. 792, 1987, pp. 178-189.

Guden, M., et al., "Material parameters of quaternary III-V semiconductors for multiplayer mirrors at 1.55 µm wavelength", article, Modeling Simulation Material Science Engineering, vol. 4 1966, pp. 349-357.

Guo, C., et al., "Theoretical investigation of strained InGaAs/GaPAsSb type-II quantum wells on GaAs for long wavelength (1.3 µm) optoelectronic devices", post-conference paper, Dept of Electrical Enginering & Center for Solid State Electronics Research, ASU, Tempe, AZ, Apr. 1999, pp. 30-31.

Guy, D., et al., "Theory of an electro-optic modulator based on quantum wells in a semiconductor étalon", conference paper, Quantum Well and Superlattice Physics, Mar. 23-24, 1987, pp. 189-196.

Hall, E., et al., "Electrically-pumped, single-epitaxial VCSELs at 1.55 µm with Sb-based mirrors", article, Electronics Letters, vol. 35, No. 16, Aug. 5, 1999, pp. 1-2.

Hall, E., et al., "Increased lateral oxidation rates of AlInAs on InP using short-period superlattices", article, Applied Physics Letters, vol. 29, No. 9, Jan. 8, 2002, pp. 1100-1104.

Hall, E., et al., "Selectively etched undercut apertures in AlAsSb-based VCSELs", article, IEEE Photonics Technology Letters, vol. 13, No. 2, Feb. 2001, pp. 97-99.

Hegblom, E., et al., "Small efficient vertical cavity lasers with tapered oxide aperatures", article, Electronics Letters, vol. 34, No. 9, Apr. 30, 1998, pp. 895-896.

Heroux, J., et al., "Optical investigation of InGaAsN/GaAs strained multi-quantum wells", 20th North American Conference on Molecular Beam Epitaxy, Oct. 1-3, 2001, p. 2.

Hong, Y., et al., "Improving Ga(In)Nas properties by migration-enhanced epitaxy and superlattices", 43rd 2001 Electronic Material Conference, Session G, Paper G10, Jun. 27, 2001.

Hong, Y., et al., "Growth of GaInNAs quaternaries using a digital allow technique", conference paper, Journal of Vacuum Science and Technology B: Microelectronics and Nanometer Structures, Oct. 1-3, 2001, pp. 1163-1166.

Huffaker, D., et al., "1.15 µm wavelength oxide-confined quantum-dot vertical-cavity surface-emitting laser", article, IEEE Photonics Technology Letters, vol. 10, No. 2, Feb. 1998, pp. 185-187.

Huffaker, D., et al., "1.3 µm room-temperature GaAs-based quantum-dot laser", Applied Physics Letters, vol. 73, No. 18, Nov. 2, 1998, pp. 2564-2566.

Iga, K., "Semiconductor laser in the 21st century", California conference papers, Photodetectors: Materials and Devices VI, Jan. 22-24, 2001, pp. xi-xxv.

Jayaraman, V., et al., "Uniform threshold current, continuous-wave, singlenode 1300 nm vertical cavity lasers from 0 to 70° C.", article, Electronics Letters, vol. 34, No. 14, Aug. 9, 1998, pp. 1405-1407.

Kim, J., et al., "Epitaxially-stacked multiple-active-region 1.55 µm lasers for increased differential efficiency", article, Applied Physics Letters, vol. 74, No. 22, May 31, 1999, pp. 3251-3253.

Kim, J., et al., "Room-temperature, electrically-pumped multiple-active-region VCSELs with high differential efficiency at 1.55 µm", article, Electronics Letters, vol. 35, No. 13, Jun. 24, 1999, pp. 1-2.

Kotaki, Y., et al., "GaInAsP/InP surface emitting layser with two active layers", article, Extended Abstracts of the 16th (1984 International) conference on Solid State Devices and Materials, pp. 133-136.

Koyama, F., et al., "Room temperature CWS operation of GaAs vertical cavity surface emitting laser", article, The Transactions of the IEICE, vol. E71, No. 11, Nov. 1988, pp. 1089-1090.

Larson, J., et al., "GaInNAs-GaAs long-wavelength vertical-cavity surface-emitting laser diodes", article, IEEE Photonics Technology Letters, vol. 10, No. 2, Feb. 1998, pp. 188-190.

Lee, Y., et al., "Physics and nonlinear device applications of bulk and multiple quantum well GaAs", invited paper, SPIE vol. 792 Quantum Well and Superlattice Physics (1987), pp. 128-133.

Li, J., et al., "Persistent photoconductivity in $Ga_{1-x}In_x N_yAs_{1-y}$", article, Applied Physics Letters, vol. 75, No. 13, Sep. 27, 1999, pp. 1899-1901.

Mirin, R., et al., "1.3 µm photoluminescence from InGaAs", article, Applied Physics Letter 67 (25), Dec. 18, 1995, pp. 3795-3797.

Nakagawa, S., et al., "1.55 µm InP-lattice-matched VCSELs with AlGaAsSb-AlAsSb DBRs", article, IEEE Journal on Selected Topics in Quantum Electronics, vol. 7, No. 2, Mar./Apr. 2001, pp. 224-230.

Nakahara, K., et al., "1.3 µm continuous-wave lasing operation in GaInNAs quantum-well lasers", article, IEEE Photonics Technology Letters, vol. 10, No. 4, Apr. 1998, pp. 487-488.

Naone, R., et al., "Tapered air apertures for thermally robust VCL structures", article, IEEE Photonics Technology Letters, vol. 11, No. 11, Nov. 1999, pp. 1339-1341.

Nelson, D., et al., "Band nonparabolicity effects in semiconductor quantum wells", article, Rapid Communications, vol. 35, No. 17, Feb. 15, 1987, pp. 7770-7773.

Ohnoki, N., et al., "Superlattice AlAs/AlInAs-oxide current aperture for long wavelength InP-based veritcal-cavity surface-emitting laser structure", article, Applied Physics Letters, vol. 73, No. 22, Nov. 30, 1998, pp. 3262-3264.

Ortsiefer, M., et al., "Submiliamp long-wavelength InP-based vertical-cavity surface-emitting laser with stable linear polarization", article, Electronics Letters, vol. 36, No. 13, Jun. 22, 2000, pp. 1124-1126.

Peters, M., et al., "Realization and modeling of a pseudomorphic $(GaAs_{1-x}Sb_x-In_y Ga_{1-y}As)/GaAs$ bilayer-quantum well", Applied Physics Letter 67 (18), Oct. 30, 1995, pp. 263941.

Peters, M., et al., Band-gap engineered digital alloy interfaces for lower resistance vertical-cavity surface-emitting lasers, article, Applied Physics Letters, vol. 63, No. 25, Dec. 1993, pp. 3411-3413.

Piprek, J., et al., "Thermal comparison of long-wavelength vertical-cavity surface-emitting laser diodes", Electronics Letters, May 26, 1994, vol. 30, No. 11, pp. 866-868.

Piprek, J., et al., "Minimum temperature sensitivity of 1.55 µm vertical-cavity lasers at —30 nm gain offset", article, Applied Physics Letters, vol. 72, No. 15, Apr. 13, 1998, pp. 1814-1816.

Raja, M., et al., "Novel wavelength-resonant optoelectronic structure and its application to surface-emitting semiconductor lasers", article, Electronics Letters, Sep. 1, 1988, vol. 24, No. 18, pp. 1140-1142.

Scott, J., et al., "High efficiency submilliamp vertical cavity lasers with intracavity contacts", article, IEEE Photonics Technology Letters, vol. 6, No. 6, Jun. 1994, pp. 678-680.

Anan, T., et al., "Continuous-wave operation of 1.30 µm GaAsSb/GaAs VCSELs", article, Electronics Letters, vol. 37, No. 9, Apr. 26, 2001, pp. 566-567.

Yang, X., et al., "High temperature characteristics of 1.3 µm InGaAsN:Sb/GaAs multiple-quantum-well lasers grown by molecular-beam epitaxy", article, Applied Physics Letters, vol. 76, No. 7, Feb. 14, 2000, pp. 795-797.

Livshits, D., et al., "8W continuous wave operation of InGaAsN lasers of 1.3 µm", article, Electronics Letters, vol. 36, No. 16, Aug. 3, 2000, pp. 1381-1382.International Search Report, dated Mar. 27, 2003, relative to PCT application No. PCT/US02/39414, the foreign equivalent to the instant U.S. Appl. No. 10/026,055.

Yang, X., et al., "High temperature characteristics of 1.3 mum InGaAsN:Sb/GaAs multiple-quantum-well laser grown by molecular-beam epitaxy", article, Applied Physics Letters, vol. 76, No. 7, Feb. 14, 2000, pp. 795-797.

Miyamoto t et al: "A novel galnnas-gaas quantum-well structure for long-wavelength semiconductor lasers" IEEE photonics technology letters, IEE Inc. New York, US vol. 9, No. 11, Nov. 1997 pp. 1448-1450.

Notification of Transmittal of the International Search Report or the Declaration dated Jan. 2, 2004, relative to PCT. Application No. PCT/US02/39604, the foreign equivalent to the instant U.S. Appl. No. 10/026,019.

Sekiguchi, S , et al., "Long wavelength GaInAsP/InP laser with n-n contacts using AlAs/InP hole injecting tunnel junction", article, Japanese Journal of Applied Physics, Part 2, No 4B, Apr. 4, 1999, pp. L443-445.

Starck, C., "Long wavelength VCSEL with tunnel junction and metamorphic AlAs/GaAs conductive DBR", article, Physics Review B, vol. 39, No. 3, Jan. 15, 1989, pp. 1871-1883.

Sugimoto, M., et al., "Surface emitting devices with distribut4ed Bragg refectors grown by highly precise molecular beam epitaxy", article, Journal of Crystal Growth, vol. 127, 1993, pp. 1-4.

Uchida, T., et al., "CBE grown 1.5 µm GaInAsP-InP surface emitting lasers", article, IEEE Journal of Quantum Electronics, vol. 29, No. 6, Jun. 1993, pp. 1975-1980.

Van De Walle, C. "Band lineups and deformation potentials in the model-solid theory", article, Physical Review B, vol. 39, No. 3, Jan. 15, 1989, pp. 1871-1883.

Whitaker, T , "Long wavelengths VCSELs move closer to reality", article, Compound Semiconductor, Jul. 2000, pp. 65-67.

Yamada, M., et al., "Low-threshold lasing at 1.3 µm from GaAsSb quantum wells directly grown on GaAs substrates", article, IEEE, 0-7803-4947, Apr. 1998, pp. 149-150.

Yamada, M., et al., "Room temperature low-threshold CW operation of 1.23 µm GaAsSb VCSELs on GaAs substrates", article, Electronics Letters, Mar. 30, 2000, vol. 36, No. 7, pp. 631-638.

Yang, X., et al., "High performance 1.3 µm InGaAs N:Sb/GaAs quantum well lasers grown by molecular beam epitaxy", journal article, Journal of Vacuum Science and Technology B Microelectronics and Nanometer Structures, Vo. 18, No. 3, Oct. 1999, pp. 1484-1487.

Yang, X., et al., "InGaAsNSb/GaAs quantum wells for 1.55 µm lasers grown by molecular-beam epitaxy", article, Applied Physics Letters, vol. 78, No. 26, pp. 4068-4070.

Yano, M., et al., "Time-resolved reflection high energy electron diffraction analysis for atomic layer depositions of GaSb by molecular beam epitaxy", article, Journal of Crystal Growth, vol. 146, 1995, pp. 349-353.

Yuen, W., et al., "High-performance 1.5 µm single-epitaxy top-emitting VCSEL", article, Electronics Letters, vol. 36, No. 13, Jun. 22, 2000, pp. 1121-1123.

* cited by examiner

VERTICAL CAVITY SURFACE EMITTING LASER INCLUDING INDIUM AND NITROGEN IN THE ACTIVE REGION

TECHNICAL FIELD

This invention relates to vertical cavity surface emitting lasers and more particularly to vertical cavity surface emitting lasers utilizing a combination of nitrogen, aluminum, antimony, phosphorous and/or indium as a material system and as a means to increase VCSEL device wavelength.

RELATED APPLICATIONS

The present invention is related to the following co-pending patent applications: Ser. No. 10/026,016 entitled "Vertical cavity surface emitting laser including indium, antinomy and nitrogen in the active region," filed Dec. 20, 2001; Ser. No. 10/026,020 entitled "Vertical cavity surface emitting laser including indium and antinomy in the active region," filed Dec. 27, 2001; Ser. No. 10/026,044 entitled "Indium free vertical cavity surface emitting laser," filed Dec. 27, 2001; and Ser. No. 10/026,055 entitled "Vertical cavity surface emitting laser including indium in the active region," filed Dec. 27, 2001.

BACKGROUND OF THE INVENTION

Solid-state semiconductor lasers are important devices in applications such as optoelectronic communication systems and high-speed printing systems. Recently, there has been an increased interest in vertical cavity surface emitting lasers ("VCSELs") although edge emitting lasers are currently used in the vast majority of applications. A reason for the interest in VCSELs is that edge emitting lasers produce a beam with a large angular divergence, making efficient collection of the emitted beam more difficult. Furthermore, edge emitting lasers cannot be tested until the wafer is cleaved into individual devices, the edges of which form the mirror facets of each device. On the other hand, not only does the beam of a VCSEL have a small angular divergence, a VCSEL emits light normal to the surface of the wafer. In addition, since VCSELs incorporate the mirrors monolithically in their design, they allow for on-wafer testing and the fabrication of one-dimensional or two-dimensional laser arrays.

VCSELs are typically made by growing several layers on a substrate material. VCSELs include a first mirrored stack, formed on the substrate by semiconductor manufacturing techniques, an active region, formed on top of the first mirrored stack, and a second mirrored stack formed on top of the active region. By providing a first contact on top of the second mirrored stack, and a second contact on the backside of the substrate, a current is forced through the active region, thus driving the VCSEL.

The active region is made up further of one or more quantum wells sandwiched between two spacer cladding regions. Inside the spacers, the active region is sandwiched by confining layers. The confining layers or regions are used to provide electrical confinement of minority carriers. By selecting the appropriate materials for the quantum well, the confining layers, and the barrier layers, a VCSEL generally may be grown or fabricated that generates light at a desirable, predetermined wavelength. For example, by using InGaAs quantum wells on GaAs substrates longer wavelength VCSELs can be produced. The use of InGaAs quantum wells, however, causes strain in the quantum wells. If the quantum wells are grown past their critical thickness, they relax by creating dislocations, and thus a poor quality active region.

The thickness of the various layers in the active region while not arbitrary have some flexibility within the constraints of the design and the process. The combined thickness of the spacers, the confining layers, the barriers and the active regions sandwiched by the mirrors must be such that a Fabrey Perot resonator is formed. The quantum wells should be positioned so that they are roughly centered at an antinode of the electric field. These two requirements define the spacer thickness in terms of the other layer thicknesses. The barrier layer thicknesses between the quantum wells need to be thick enough to adequately define the quantum wells, but thin enough that the quantum well positions are not excessively far from the antinode of the electric field. The thickness of the barrier layers at the boundaries of the quantum well regions have some flexibility. Optimally they need to be at least thick enough that the energy levels of each of the quantum wells is nominally the same. They can be thicker if material quality issues require this. The confining layers are often one in the same with the spacers or, as is shown in this work, can grade stepwise or continuously in the valence and conduction bands towards that of the barriers. Sometimes the confining layers and barrier layers are made from the same compositions, but this is not optimal for carrier confinement and is usually a compromise made for processing reasons.

The thickness of the quantum well is related by quantum mechanics to the well and barrier compositions, the desired emission wavelength, and the density of states. With a higher density of states narrower quantum wells can be optimally used.

What is needed in the VCSEL art are means to achieve long wavelength quantum wells normally fabricated on GaAs substrates. The present inventor has recognized that it would be advantageous to remedy the foregoing and other deficiencies in the prior art, and to facilitate the easier production of longer wavelength VCSELs. Accordingly, the present invention is described and presented as a novel methods and means to address the shortcomings currently found in the art.

SUMMARY OF THE INVENTION

The following summary of the invention is provided to facilitate an understanding of some of the innovative features unique to the present invention, and is not intended to be a full description. A full appreciation of the various aspects of the invention can be gained by taking the entire specification, claims, drawings, and abstract as a whole. Additional objects and advantages of the current invention will become apparent to one of ordinary skill in the art upon reading the specification.

In accordance with addressing the limitations of the prior art, presented are new and improved features applied to the solid state laser art that are capable of providing longer wavelength VCSEL devices.

It is a feature of the present invention to provide a method of fabricating improved VCSELs.

In accordance with various aspects of the present invention, quantum wells and/or associated barrier layers can be grown with several novel combinations of nitrogen, aluminum, antimony, phosphorous and/or indium placed within or about a typical GaAs substrate to achieve long wavelength VCSEL performance, e.g., within the 1260 to 1650 nm range useful for fiberoptic communication.

In accordance with a feature of the present invention, a VCSEL is provided wherein InGaAs with N is introduced in the quantum well(s) with confining regions comprised of AlGaAs.

In accordance with another feature of the present invention, a VCSEL is provided wherein InGaAs with N is introduced in the quantum well(s) and the barrier layers.

In accordance with another feature of the present invention, a VCSEL is provided wherein InGaAs with N is introduced in the quantum well(s) and barrier layers and aluminum is added to the confining layers.

In accordance with another feature of the present invention, a VCSEL is provided wherein InGaAs with N is introduced in the quantum well(s) and Al is introduced in the barrier and confining layers.

In accordance with another feature of the present invention, a VCSEL is provided wherein InGaAs with Sb and >1% N is added to the quantum well(s).

In accordance with another feature of the present invention, a VCSEL is provided wherein InGaAsN and Sb are introduced in the quantum well(s) and GaAsN is introduced in the barrier layers.

In accordance with another feature of the present invention, a VCSEL is provided wherein an InGaAsSbN quantum well is provided with GaAsP barrier layers and AlGaAs confinement layers.

In accordance with another feature of the present invention, a VCSEL is provided wherein InGaAs is provided in the quantum well(s) (no N) with GaAsN barrier layers and AlGaAs confining regions.

In accordance with another feature of the present invention, a VCSEL is provided wherein AlGaAs barrier layers are provided with at least one GaAs quantum well including N, Sb and/or In introduced in the quantum well(s).

In accordance with another aspect of the present invention, Nitrogen can be added to the barrier layers of the InGaAs quantum wells of a VCSEL such that the barrier layers are in tension while the quantum wells are in compression. To compensate for the property changes inherent with the addition of Nitrogen to InGaAs quantum wells, quantum well thickness can be reduced. Nitrogen can be useful for strain compensation and overall band gap reduction within the active region.

In accordance with another feature of the present invention, AlGaAs or AlGaAsN can be used for minority carrier confinement in the barrier layers to avoid type 2 behavior in the valence band.

In accordance with another feature of the present invention, Nitrogen or nitrogen and Sb can be used in GaAs or InGaAs quantum wells. The Sb and nitrogen are balanced to avoid a type 2 transition in either the valence band or the conduction band and maintain excellent carrier confinement with at least a 0.1 ev band discontinuity of both the valence and conduction bands at the quantum well edge.

In accordance with features of the present invention, a vertical cavity surface emitting laser (VCSEL) can include at least one quantum well comprised of InGaAsN; barrier layers sandwiching said at least one quantum well; and confinement layers sandwiching said barrier layers. Confinement and barrier layers can comprise AlGaAs, GaAsN. Barrier layers can also comprise InGaAsN. Quantum wells can also include Sb.

Quantum wells can be developed up to and including 50 Å in thickness. Quantum wells can also be developed with a depth of at least 40 meV.

BRIEF DESCRIPTION OF THE DRAWINGS

The accompanying figures, in which like reference numerals refer to identical or functionally-similar elements throughout the separate views and which are incorporated in and from part of the specification, further illustrate the present invention and, together with the detailed description of the invention, serve to explain the principles of the present invention.

DETAILED DESCRIPTION OF THE INVENTION

The novel features of the present invention will become apparent to those of skill in the art upon examination of the following detailed description of the invention or can be learned by practice of the present invention. It should be understood, however, that the detailed description of the invention and the specific examples presented, while indicating certain embodiments of the present invention, are provided for illustration purposes only because various changes and modifications within the scope of the invention will become apparent to those of skill in the art from the detailed description of the invention and claims that follow.

Making long wavelength quantum wells on GaAs has proven to be very difficult, but technology presented in this the following description has advanced to the point that longer wavelength quantum wells and higher efficiency VCSELs are now feasible. One issue is that long wavelength compounds tend to not be lattice matched to GaAs. This has been alleviated recently using nitrogen in the quantum wells, which reduces the energy band and reduces the lattice constant in contrast to every other band gap reducing element, thus allowing the inclusion of other elements (e.g., In, Sb), and which reduces the band gap but increases the lattice constant. Unfortunately, the use of nitrogen can have the negative aspect of reducing confinement in the valence band and may tend to make poorer utility material as more nitrogen is added.

This invention can use strain compensation with or without nitrogen in the barrier layers to allow more indium and/or Sb incorporation in the quantum wells without relaxation and thus achieve longer wavelengths. A trade off of the effects on well depth of the Sb and N can also be accomplished so that conduction band wells of at least 0.07 ev and valence band wells of at least 0.05 ev are achievable.

Figure 1:
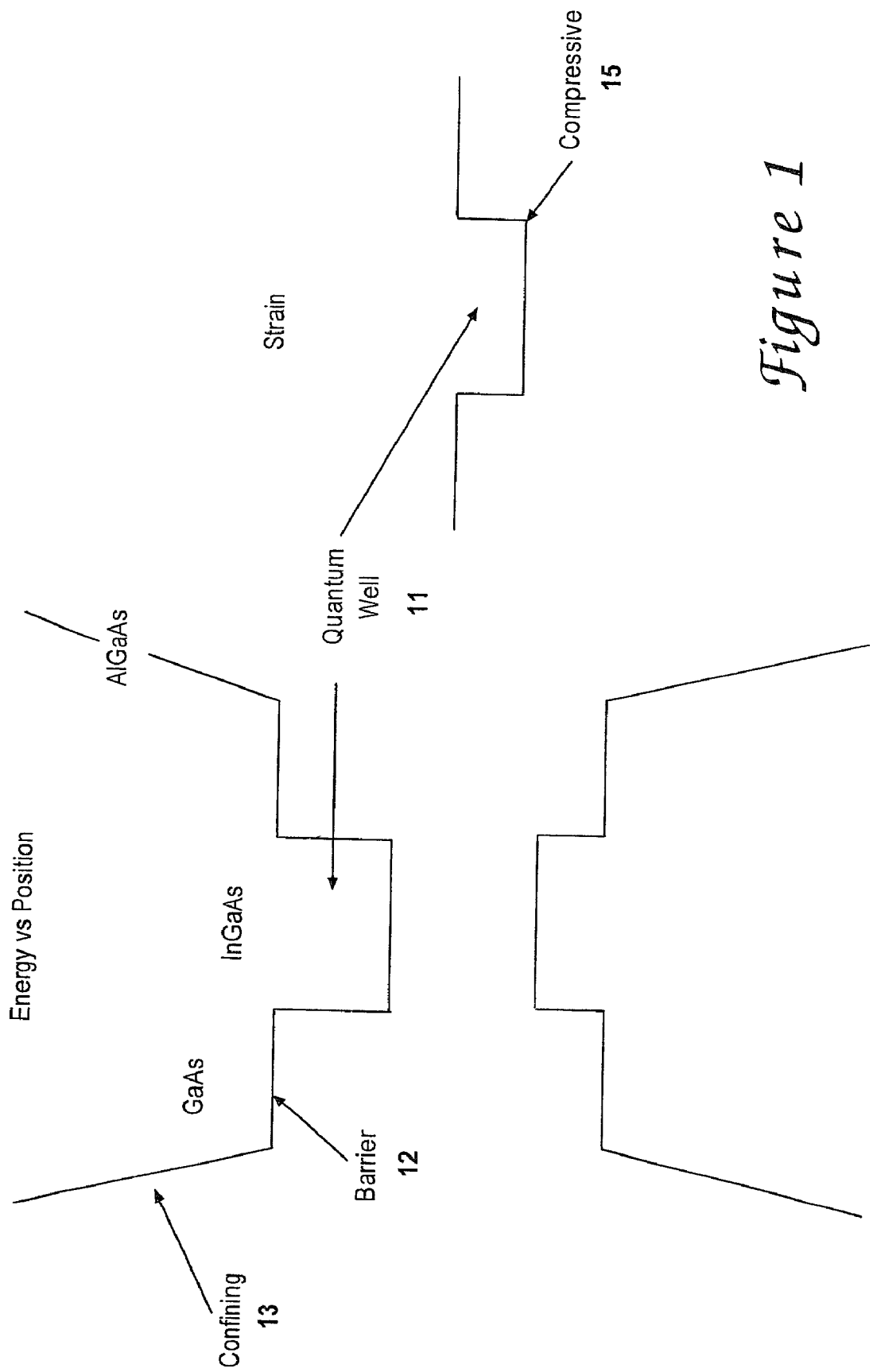
FIG. 1 is a graphical illustration of energy v. position and strain for a VCSEL having AlGaAs confinement areas, GaAs barrier layers and InGaAs quantum wells.

A preliminary description to FIGS. 1-11 will now be provided prior to describing the benefits of the invention in detail. Referring to FIG. 1, portions of the illustrations in FIGS. 1-11 on the left hand-side of the drawings are meant to graphically represent the position of a quantum well 11, barrier layers 12, and confinement layers 13 of a VCSEL. Power is represented by drawing lines made vertically with respect to the position of the components mentioned. On the right hand of FIGS. 1-11, strain for each illustrated device is also shown graphically, with compression also being represented vertically downwards and tension represented vertically upwards.

Referring to FIG. 1, a graphical illustration of "energy v. position" and "strain" for a VCSEL having AlGaAs confinement layers 13, GaAs barrier layers 12 and an InGaAs quantum well 11 is shown and will serve as a benchmark for adjustments made in FIGS. 2-11. With use of a InGaAs quantum well on a GaAs substrate, longer wavelengths can be achieved, however, strain is also caused in the quantum well as shown by the depth 15 of the associated strain measurement.

Figure 2:
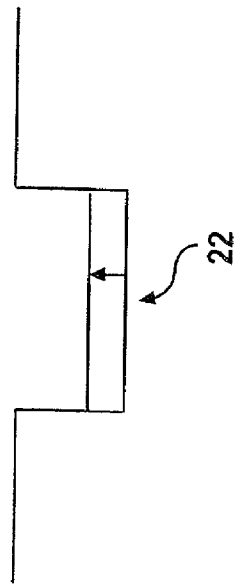
FIG. 2 is a graphical illustration of "energy v. position" and "strain" for a VCSEL having AlGaAs confinement layers, GaAs barrier layers and InGaAsN quantum wells.
Figure 2:
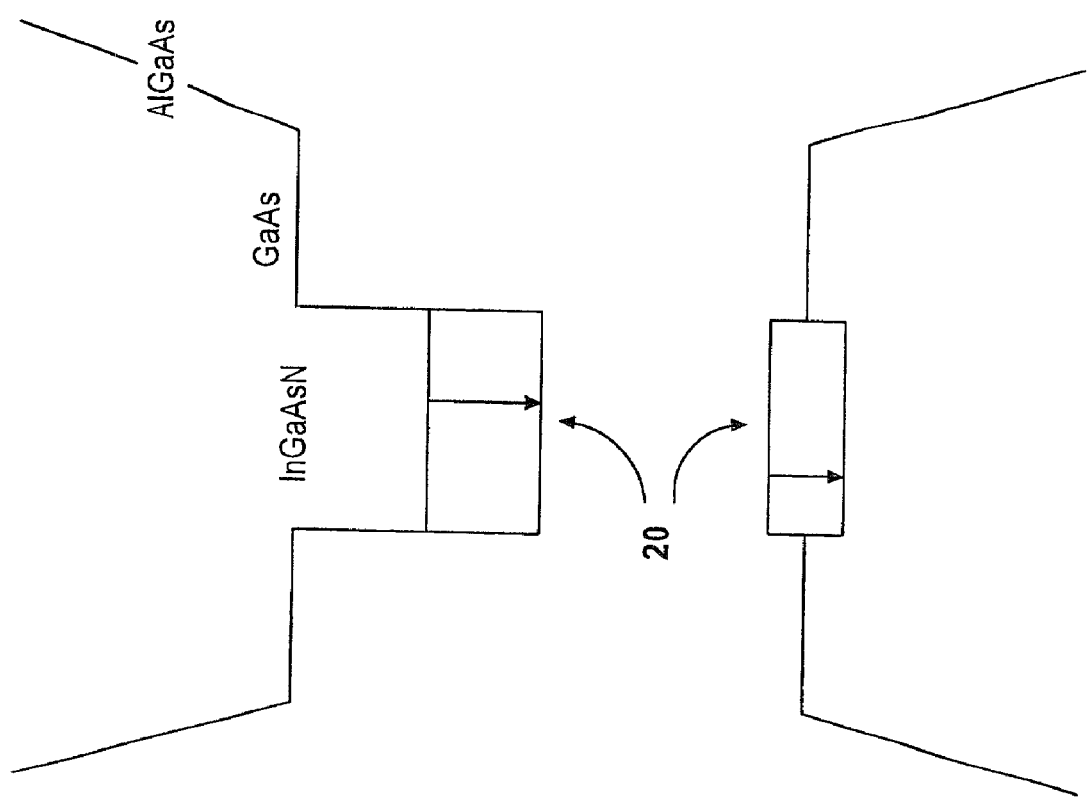

Referring to FIG. 2, a VCSEL is shown having AlGaAs confinement layers, GaAs barrier layers and a InGaAsN quantum well. Nitrogen is added to the InGaAs quantum well of FIG. 1, which resulted in a decrease 20 in energy and valence band confinement. Here in FIG. 2, however, strain was reduced 22 when compared to the nitrogen-free device of FIG. 1.

Figure 3:
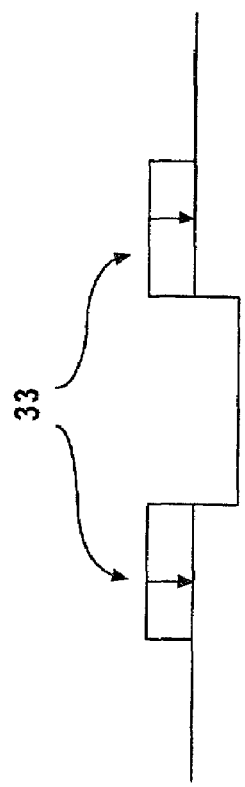
FIG. 3 is a graphical illustration of "energy v. position" and "Strain" for a VCSEL having GaAsN barrier layers and InGaAsN quantum wells.
Figure 3:
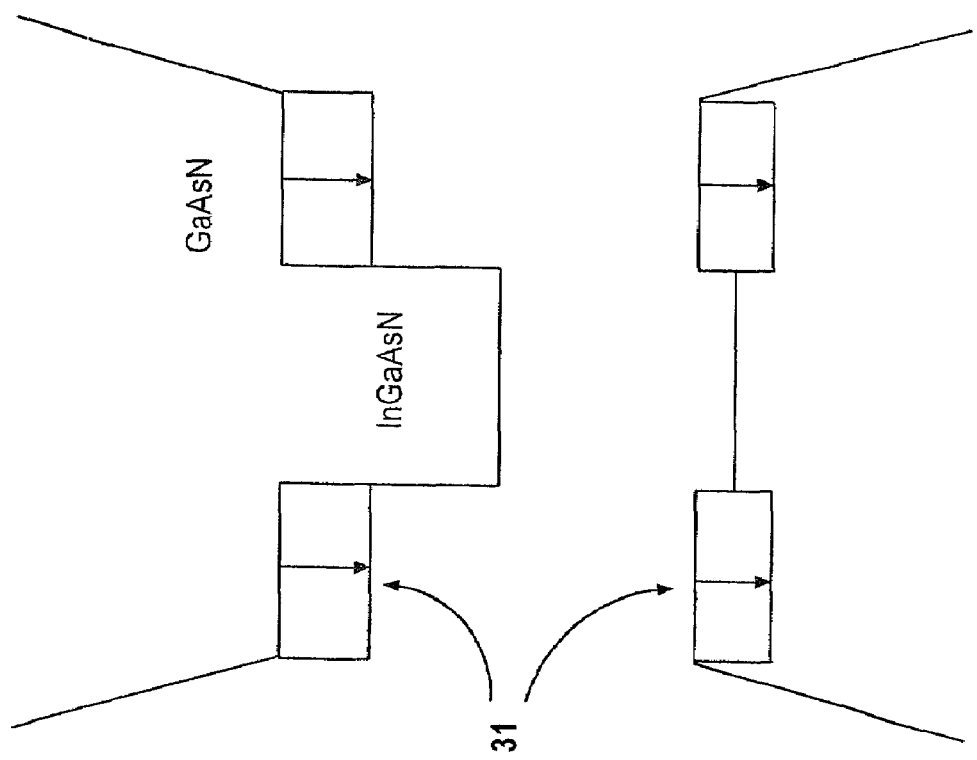

Referring to FIG. 3, nitrogen (N) is also added to the barrier layers of the device shown in FIG. 2. As shown by the arrows 31 in FIG. 3, the hole well is recreated with the introduction of nitrogen in the barrier layers. In addition, strain compensation 33 was provided to the device with the addition of nitrogen to the barrier layers. It should be noted that strain compensation would be realized even where nitrogen is not also introduced in the quantum well.

Figure 4:
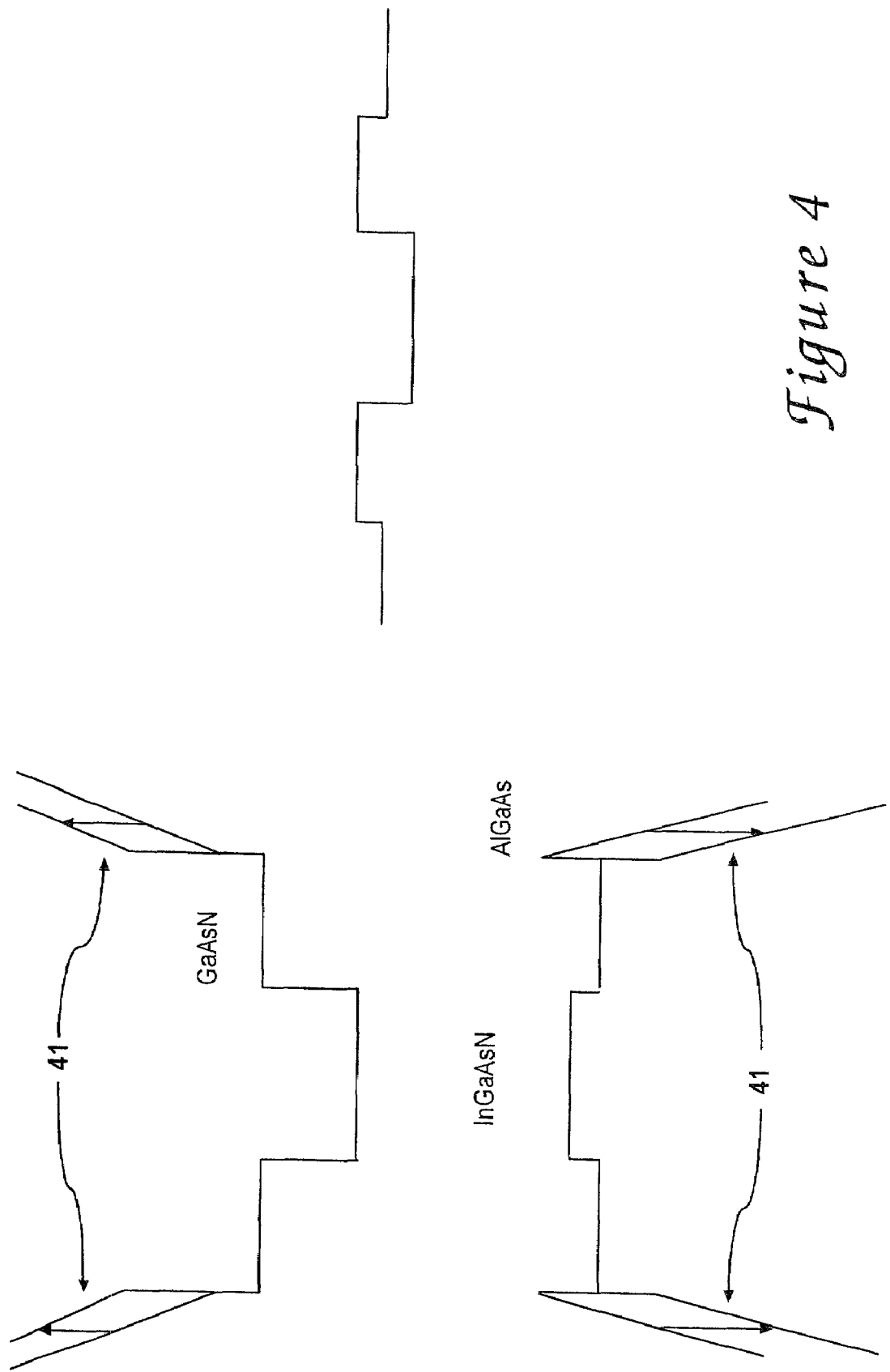
FIG. 4 is a graphical illustration of "energy v. position" and "strain" for a VCSEL having AlGaAs confinement layers, GaAsN barrier layers and InGaAsN quantum wells.

Referring to FIG. 4, aluminum (Al) is now added to the confinement layers/areas of the device shown in FIG. 3. Providing Al to the confinement layers eliminates or substantially reduces undesirable wells at the edges of the device as shown by the arrows 41 in the figure. The introduction of aluminum, however, has a negligible effect on the devices strain.

Figure 5:
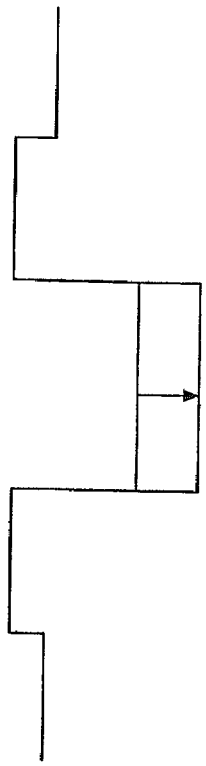
FIG. 5 is a graphical illustration of "energy v. position" and "strain" for a VCSEL having GaAsN barrier layers and InGaAsNSb quantum wells.
Figure 5:
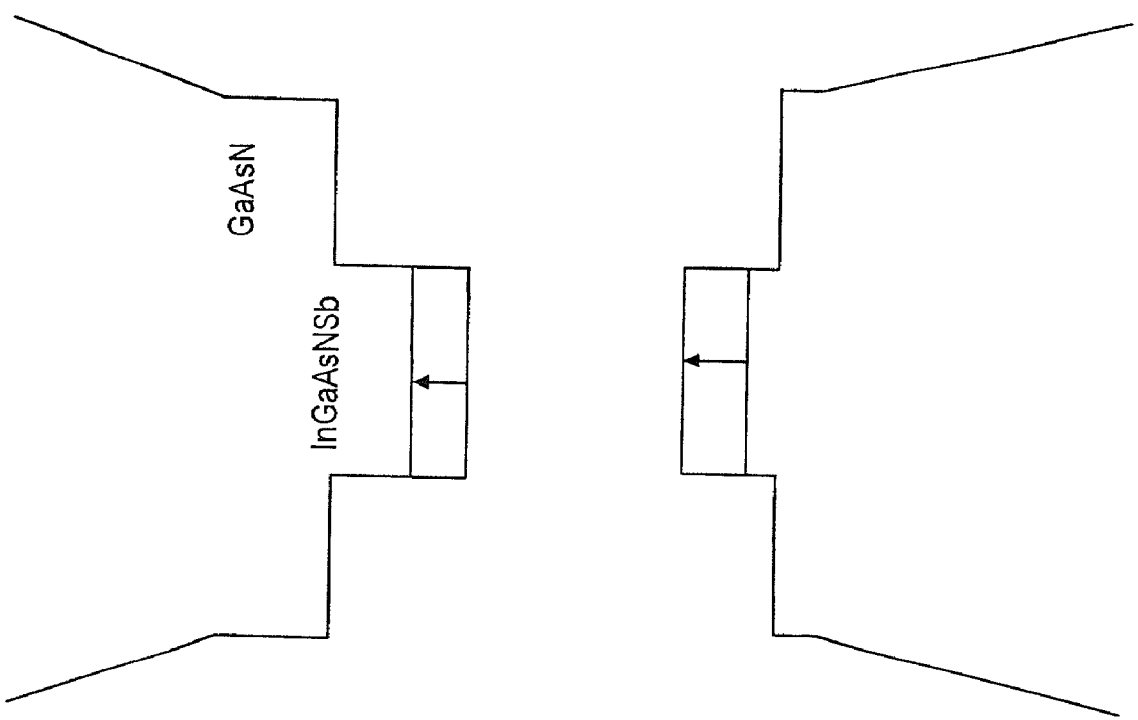

Referring to FIG. 5, antimony (Sb) is now added to the quantum well of the device previously viewed in FIG. 4. The introduction of Sb to the quantum well causes a decrease in the band gap, an increase in the valence band well, and a decrease in the conduction band well. Strain in the device is increased with the introduction of Sb.

Figure 6:
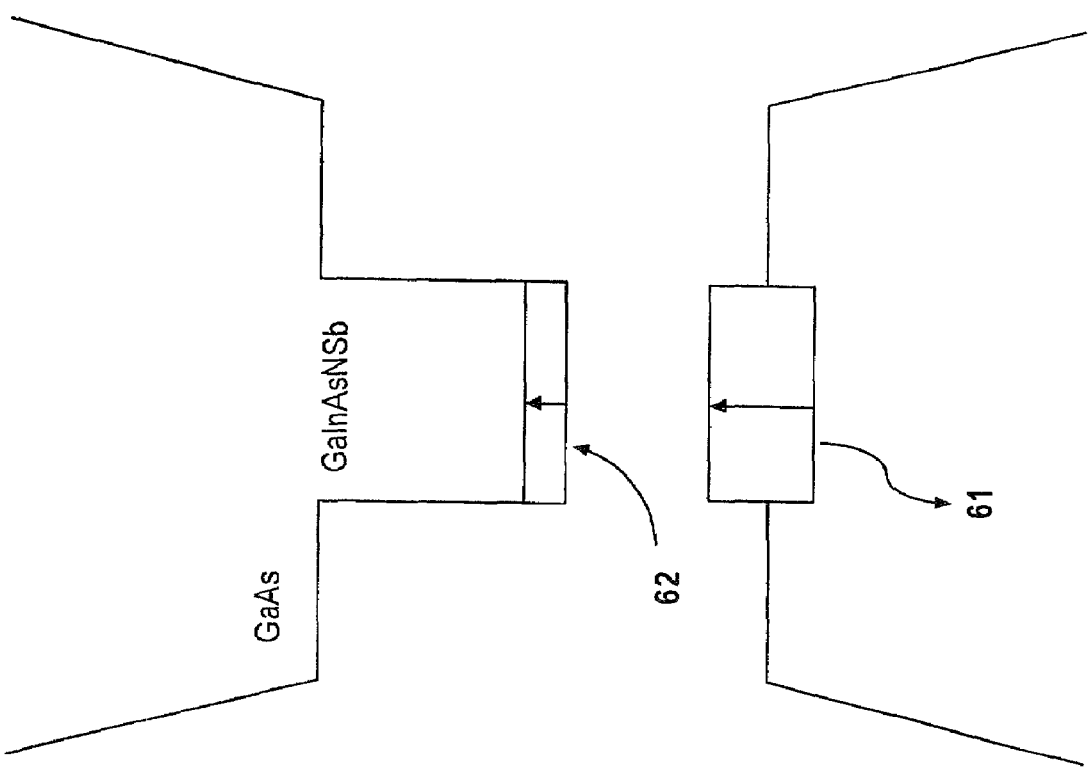
FIG. 6 is a graphical illustration of "energy v. position" and "strain" for a VCSEL having GaAs barrier layers and GaInAsNSb quantum wells.

Referring to FIG. 6, antimony (Sb) was added to the quantum well for the device illustrated in FIG. 2. The band gap for the device increases the valence band well 61, but decreases the conduction band well 62. Compressive strain in the quantum well is also shown to increase with Sb.

Figure 7:
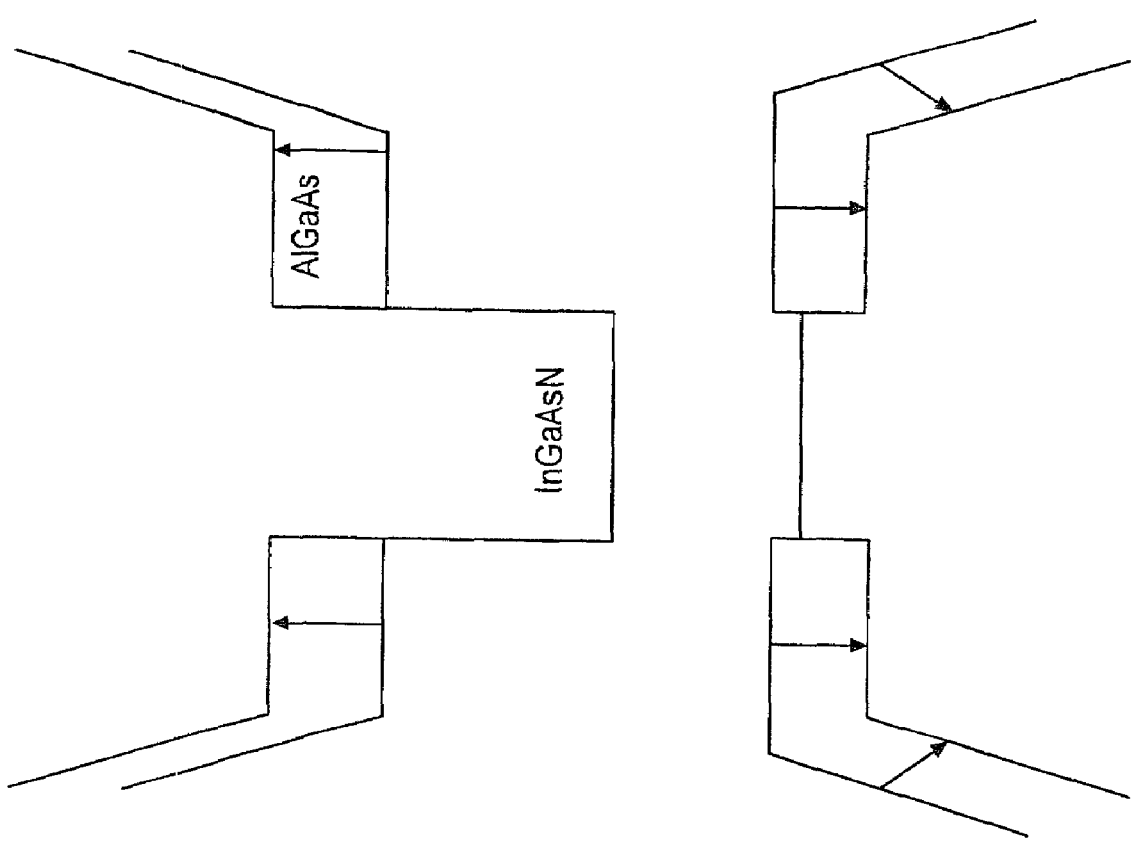
FIG. 7 is a graphical illustration of "energy v. position" and "strain" for a VCSEL having AlGaAs barrier layers and InGaAsN quantum wells.

Referring to FIG. 7, aluminum (Al) is added to the barrier and confining layers of the device first shown in FIG. 2. As seen in the graphical illustration, the valence band well is recreated using Al. Strain compensation is unremarkable from its initial position in FIG. 2.

Figure 8:
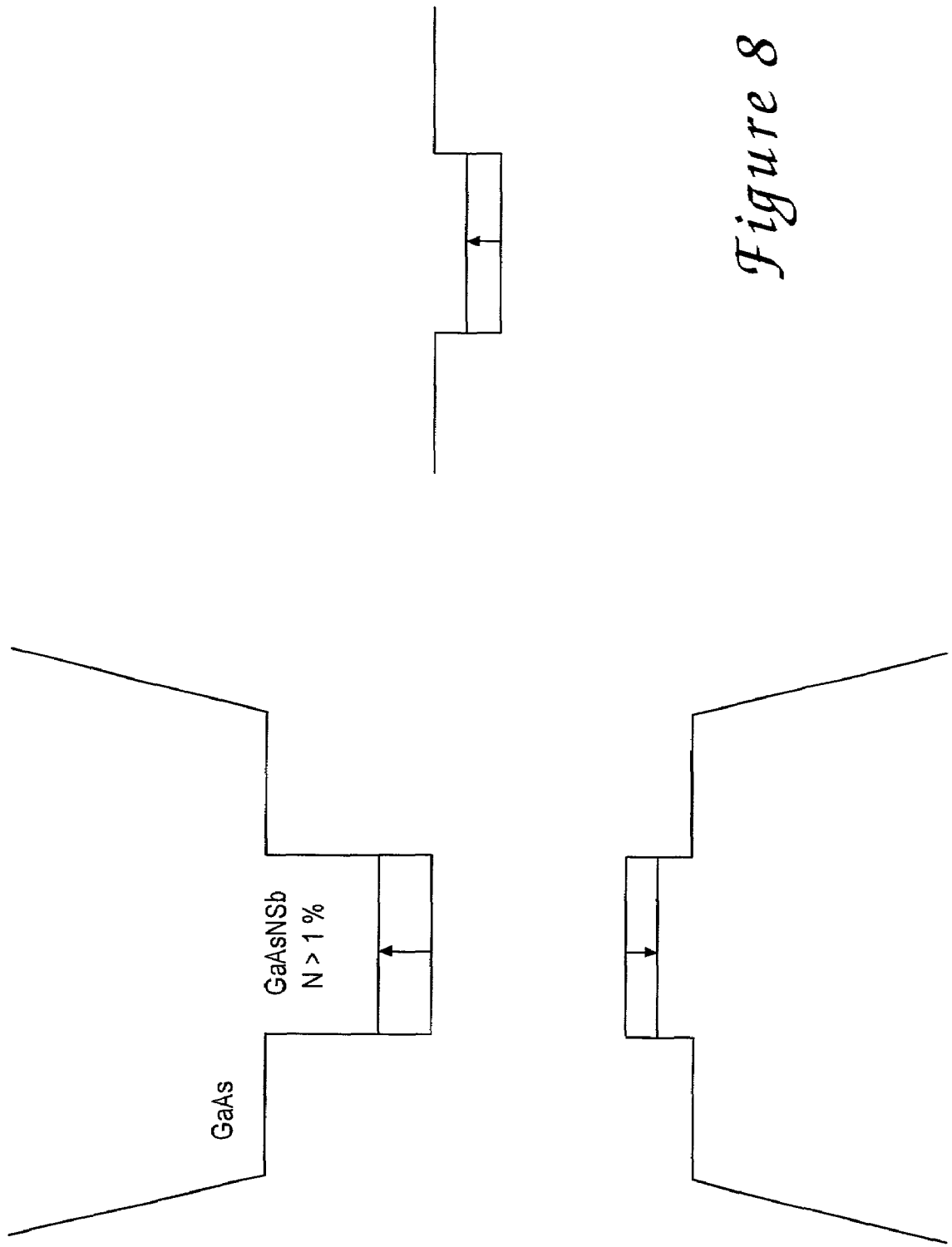
FIG. 8 is a graphical illustration of "energy v. position" and "strain" for a VCSEL having GaAs barrier layers and GaAsNSb quantum wells with >1% nitrogen.

Referring to FIG. 8, a Indium free device is shown. Indium is removed from the device shown graphed in FIG. 6. The quantum well includes GaAsNSb. Device strain is shown to improve with the removal of In.

Figure 9:
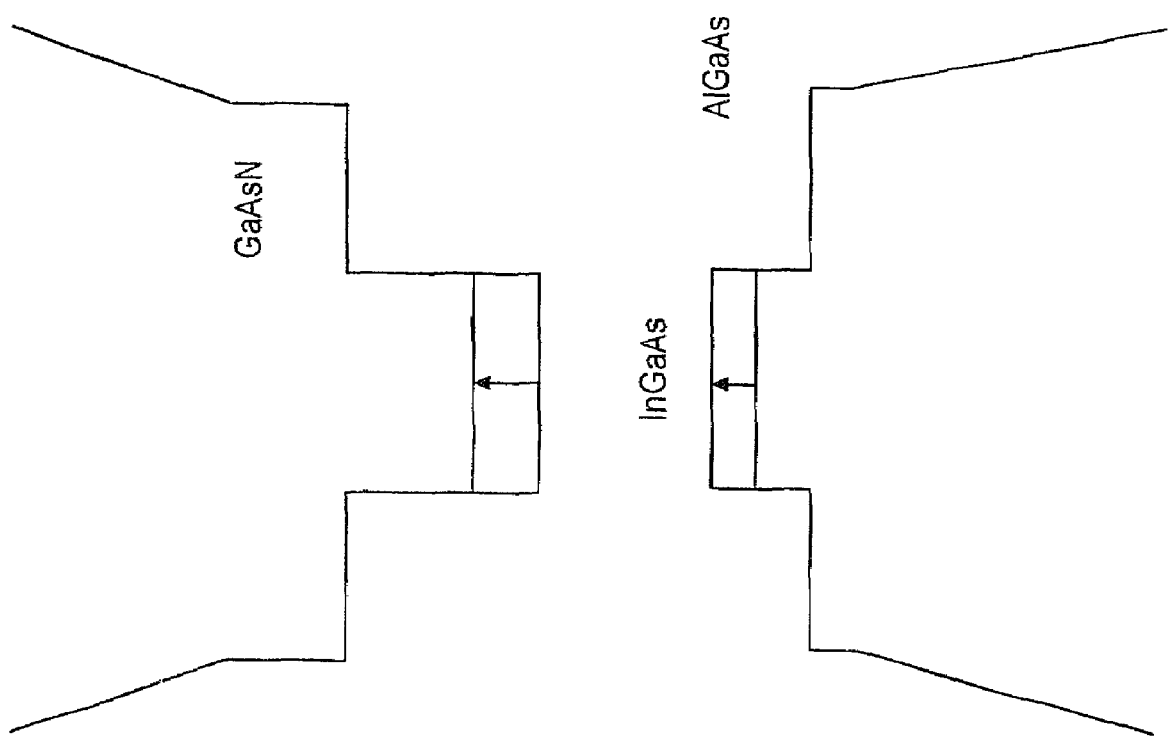
FIG. 9 is a graphical illustration of "energy v. position" and "strain" for a VCSEL having AlGaAs confinement layers, GaAsN barrier layers and InGaAs quantum wells.

Referring to FIG. 9, nitrogen is shown to be removed from the quantum well for the device shown in FIG. 4. The removal of N from the quantum well increases band gap and hole confinement. Strain, however, is also increased in the quantum well, but is compensated for in the barrier region.

Figure 10:
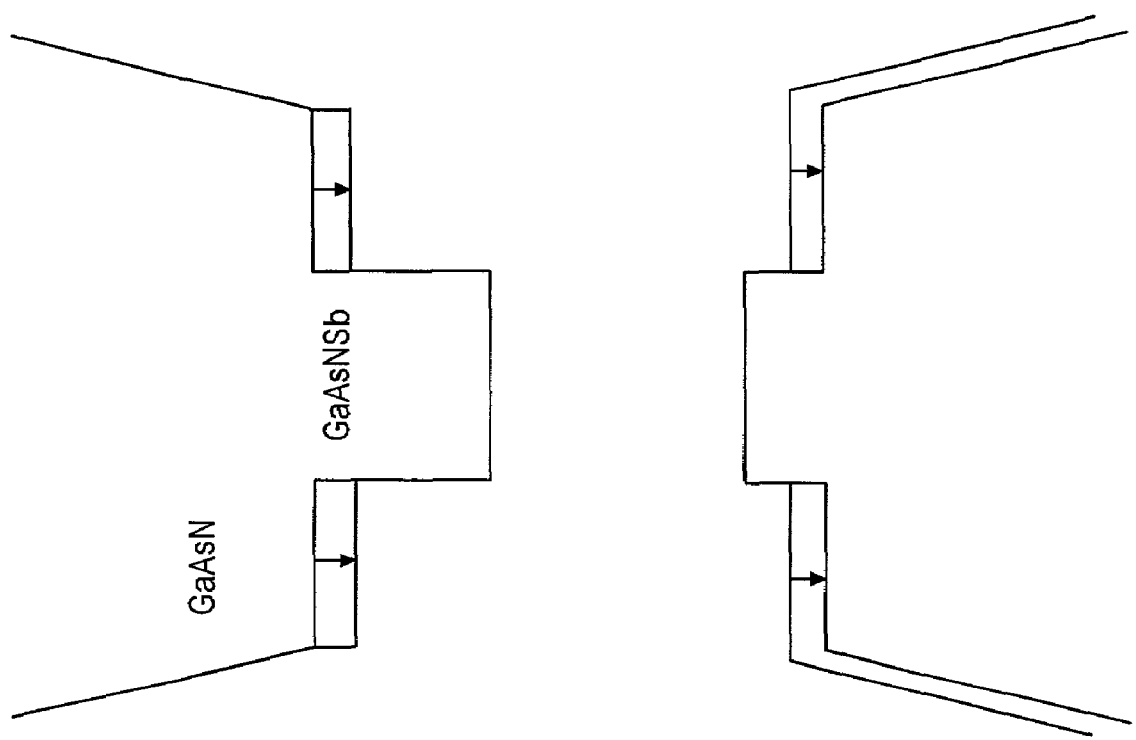
FIG. 10 is a graphical illustration of "energy v. position" and "strain" for a VCSEL having GaAsN barrier layers and GaAsNSb quantum wells.

Referring to FIG. 10, a strain compensated device is illustrated. The device of FIG. 8 is improved by adding nitrogen to the barrier layers and aluminum to the confining layers. The quantum well is GaAsSbN. This combination increases the hole well and decreases the electron well. The overall strain in the device is reduced.

Figure 11:
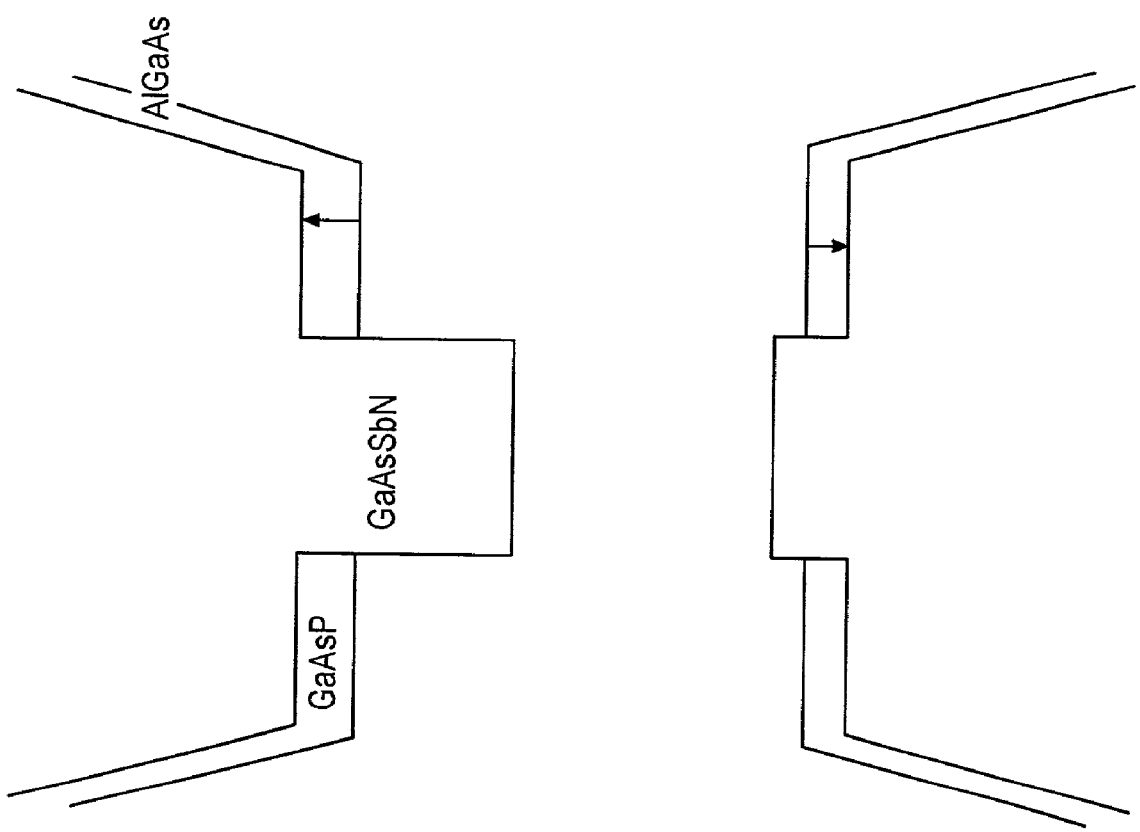
FIG. 11 is a graphical illustration of "energy v. position" and "strain" for a VCSEL having AlGaAs confinement layers, GaAsP barrier layers and GaAsSbN quantum wells.

Referring to FIG. 11, additional strain compensation is shown by adding phosphorous (P) to the barrier layers. The device in FIG. 11 is shown to have AlGaAs confinement layers, and a GaAsSbN quantum well. Indium can also be used in the quantum well.

By normal means it is impossible to reach 1310 nm quantum wells used in datacom VCSELs and edge emitters. Referring to FIG. 1, what is illustrated is a typical InGaAs strained quantum well on GaAs. By using nitrogen for strain compensation in the barriers (FIGS. 4, 9), enough indium can be added to the quantum wells without relaxation to reach 1310 nm, and because little or no nitrogen is used in the quantum well itself hole confinement and material quality are maintained. Using AlGaAs confining layers with sufficient Al to avoid extra wells being formed is advantageous.

As mentioned above, FIG. 8 shows a GaAsSbN quantum well with GaAs barriers. In this case, both Sb and nitrogen lower the band gap. The Sb causes the quantum well to tend towards poor electron confinement with good hole confinement, and the nitrogen tends to go in the opposite direction towards poor hole confinement and good electron confinement. By adjusting the ratio of these at least 0.07 ev well depth in the conduction band, and 0.05 eV depth in the valence band can be achieved while achieving both 1310 nm and 1550 nm light emission.

If large quantities of Sb and little N are used in the quantum wells such that there is excessive compressive strain in the quantum wells, invention aspect 1 can be combined with this to compensate the excessive compressive strain. That is nitrogen or phosphorous can be added to the barriers layers because it tends to deepen the electron well which the Sb in the quantum well tends to shallow the electron well. It is also useful to increase the gap of the confining layers with Al or even P once again to avoid extra wells.

Indium can be used in the quantum well of invention to adjust the wavelength, well depths and strain in the quantum wells. As the band gap shrinks, the wells become more compressive. But adding indium has only a secondary effect on the relative band offsets (valence band or conduction band) as shown in FIGS. 5 and 6. FIG. 6 will work for both 1310 nm and 1550 nm active regions.

As shown in FIG. 7, AlGaAs barrier layers can be used for InGaAsN quantum wells to increase the hole well depth. Because nitrogen increases the electron effective mass the quantum wells containing nitrogen can be made thinner, that is less than 50 A. In VCSELs, this means there are more quantum wells.

All aspects of the present invention can apply to single as well as multiple quantum wells in both edge emitters and VCSELs and other semiconductor lasers. In all of the above, at least a 0.07 ev well depth is maintained in the conduction band, and a 0.05 ev depth is maintained in the valence band.

The lack of steps obtained using 100 or 111 on orientation material makes it easier to grow more highly strained layers without relaxation. Epi flattening techniques, which reduce the bunching of steps, can be used in combination with the above. Intra-quantum well mechanical stabilizers can also be used with the above.

Figure 12:
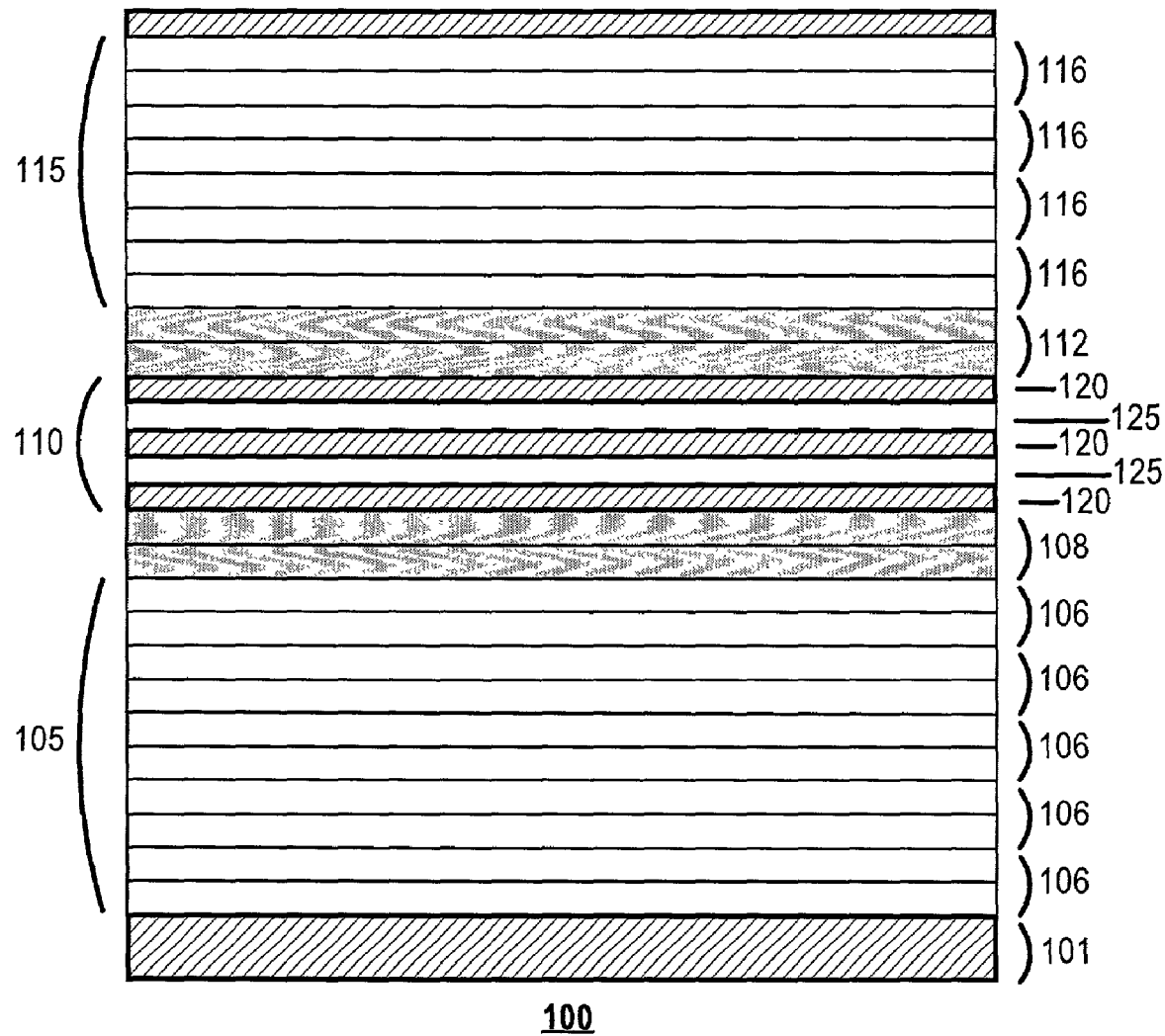
FIG. 12 is an exemplary sectional view of a VCSEL in accordance with an embodiment of the present invention.

Referring to FIG. 12, illustrated is a sectional view of a vertical cavity surface emitting laser 100 (VCSEL). The VCSEL 100 can be grown by techniques such as metal organic molecular beam epitaxy, or metal-organic chemical vapor deposition. Reference is made to U.S. Pat. No. 5,903,588, assigned to the assignee for the present invention, which describes methods of VCSEL fabrication use in the art. The VCSEL can preferably be grown on a GaAs substrate 101 due to the robust nature and low cost of the material, however it should be recognized that semiconductor materials, Ge for example, could also be used as the substrate. The VCSEL 100 can then be formed by disposing layers on the substrate.

Epitaxial layers can include: a first mirror stack 105 disposed on the substrate 101, a first cladding region 108 disposed on the first mirror stack 105, an active region 110 disposed on the first cladding region 108, a second cladding region 112 disposed on the active region 110, and a second mirror stack 115 disposed on the second cladding region 112. The active region 110 can further includes one or more quantum wells 120 being separated from each other by barrier layers 125, depending on the application for which the VCSEL 100 is designed. One of ordinary skill in the art can find it obvious to differ the number of quantum wells 120 in the VCSEL active region 110.

The first mirror stack 105 can be grown by epitaxially depositing mirror pair layers 106 on the substrate 101. In order to crystal lattice match mirror stack 105 to the substrate 101, a suitable semiconductor material system for the mirrored pairs 106 should be deposited. In this specific example, which shouldn't be taken as a limitation of the full scope of the present invention, the substrate 101 is GaAs, therefore a GaAs/AlGaAs material system can be employed. To achieve a high percentage of reflectivity, the number of mirror pair layers 106 in the stack 105 can usually range from 20 to 40, depending on the difference between the refractive indices of the layers. Different refractive indexes are also achievable by altering the Aluminum content in the mirror stack 105.

A first cladding region 108 can be made of one or more layers epitaxially disposed on the first mirror stack 105. The first cladding region 108 in the currently described embodiment of the invention can be made of a GaAsN material system.

It has been shown that Nitrogen added to the quantum well 120 can have the effect of increasing the strain between the layers, which reduces the band gap energy of the excited state. Band gap energy reduction generally decreases the amount of energy required to excite the material, and increases the wavelength of the emitted photon. This can be desirable to achieve longer wavelength VCSELs 100. The more Nitrogen that is added to the quantum well 120, the greater this reduction in band gap energy can be, and thus longer wavelength VCSELs 100 can be produced.

By using nitrogen in the GaAsN barrier layers and secondarily in the quantum wells themselves, the strain in the structure can be reduced, which can increase the allowable thickness of the quantum wells, and the energy gap can be reduced both which can increases the allowable wavelength.

The use of nitrogen in the quantum wells can make the valence band discontinuity nonconfining or type 2. By using AlGaAs or AlGaAsN as the confining material, however, and GaAsN, AlGaAs, or AlGaAsN or GaAsP barrier layers, the nonconfining problem can also be reduced. In addition, if Sb replaces a portion of the As in the quantum well, the type ll transition caused by nitrogen can further be avoided allowing even more nitrogen. Because even more nitrogen is allowable, more indium is also allowable. Because nitrogen, indium, and Sb all reduce the band gap energy, the achievable wavelengths extend to wavelengths longer than either 1310 nm used for datacom or 1550 nm used for telecom.

By adding Nitrogen to the InGaAs quantum wells, the overall strain in the well can become significantly less allowing more indium before reaching the critical thickness, thus making longer wavelength VCSELs possible. Using nitrogen for strain compensation in the barriers, the allowable strain in the quantum well region can increase meaning even more indium can be used in the quantum wells. More indium is allowable without violating the critical thickness, making for an even lower band gap and longer wavelengths. In addition, using nitrogen in the barrier layers between the quantum wells can also reduce the energy of these barriers in the conduction band making the energy of the quantum state lower, further increasing the allowable wavelength. Using nitrogen in the barrier layers can also be advantageous in avoiding type ll behavior in the valence band because as nitrogen is incorporated in the quantum wells, the conduction band discontinuity increases, and the valence band discontinuity decreases. In addition, use of AlGaAs or AlGaAsN for the confining structure can further avoid unintentional wells in the valence band at the barrier layer confining layer boundary. Finally, the use of Sb in the quantum well can reduce the band gap energy further, while avoiding the type ll behavior (allowing even more nitrogen). All of these aspects contribute to the ability to create very long wavelength active regions.

Introducing Nitrogen into the active region 110 is not generally without drawbacks. GaN and InN can have large differences in their lattice constants as well as optimal growth conditions. Due to this lattice mismatch, the quality of the material can be greatly compromised when layers comprising the active region 110 are grown beyond a certain critical thickness. Layers thicker than this critical thickness can have misfit dislocations, relaxing the strain between the layers, and decreasing the material quality. This can substantially compromises the quality of the VCSEL 100.

By including Nitrogen in the barrier layers 125, the band gap energy decrease can be observed as it is when Nitrogen is added only to the active region 110. However, the amount of Nitrogen that is needed in the active region 110 to achieve a given band gap energy reduction, and therefore a longer wavelength, can be reduced. The lattice mismatch can therefore not generally be as severe as when Nitrogen is added to the active region 110 alone, thus making the material system easier to fabricate. Higher quality VCSELs can be achieved by introducing Nitrogen into the barrier regions 125 than when Nitrogen is only added to the active region 110.

Active region 110 can next be epitaxially deposited on the first cladding region 108. The active region 110 can include one or more quantum wells 120. The preferred embodiment uses quantum wells 120 of less than 50 angstroms. When Nitrogen is introduced into the active region 110 or the cladding region 108, 112, the effective electron mass in the regions can increase dramatically. With this increased density of the states, the amount of Indium or Nitrogen needed to produce a given amount of gain in the active region 110 generally decreases. Therefore, the volume of the quantum well 120 can also be decreased, giving less volume for parasitics to occur in.

A second cladding region 112 can be made of one or more layers epitaxially disposed on the active region 110. The second cladding region 112 can be made of a GaAsN material system.

A second mirror stack 115 can next be grown by epitaxially depositing mirror pairs layers 116 on the second cladding region 115. In order to crystal lattice match mirror stack 115 to the substrate 101, a suitable semiconductor material system for the mirrored pairs 116 should be deposited. The substrate 101 is formed of GaAs, therefore a GaAs/AlGaAs material system can be employed. To achieve a high percentage of reflectivity, the number of mirror pair layers 116 in the stack 115 can usually range from 20 to 40, depending on the difference between the refractive indices of the layers. Different refractive indexes are achievable by altering the Aluminum content in the mirror stack 115.

Figure 13:
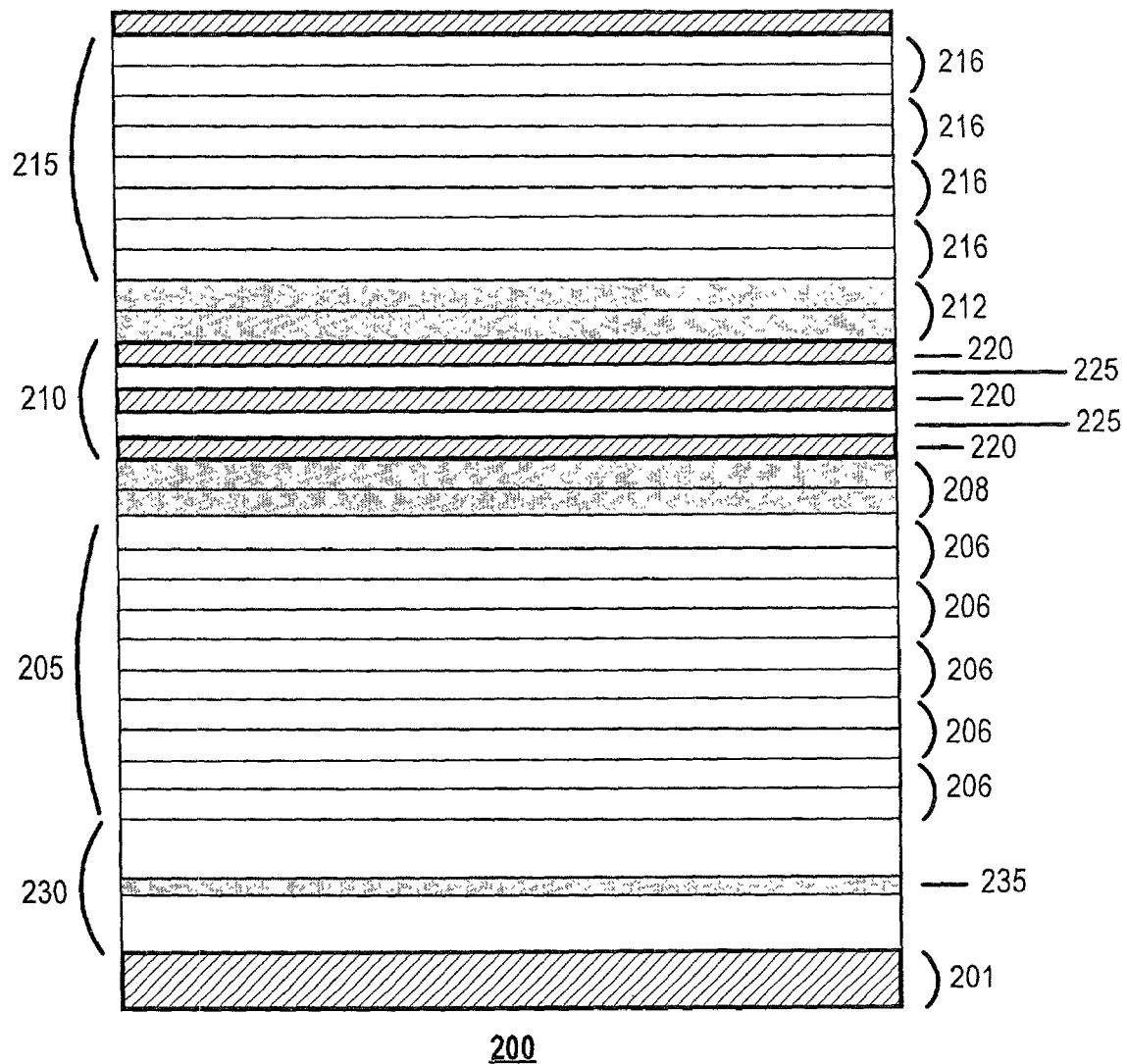
FIG. 13 is another exemplary sectional view of a VCSEL in accordance with another embodiment of the present invention.

Referring now to FIG. 13, an alternate embodiment of the present invention is shown. A flattening layer 235 can be sandwiched between the lower confining layer and the quantum wells. When the various layers are grown on the substrate, bunching of molecular steps form on the surface of the newly formed layers. The steps on the layer's surface increase the likelihood that layers adjacent to the substrate can dislocate from the substrate. A heavily compressively strained InGaAs flattening layer 235 grown before the active region 210 at a distance sufficient to minimize the straining effects on the quantum well layers generally has the effect of flattening the surface to which the active region 210 is disposed. The distance between the flattening layer 235 and the quantum wells can be several hundred angstroms. Growing this flattening layer 235 between the lower confining layer 201 and the first mirror stack 205 flattens out these molecular steps.

The surface can be further flattened when the epi layers are grown on "100 or 111 on" orientation substrates. If the substrate is in "off" orientation, the number of molecular steps can increase and the likelihood of bunching of steps increases, thereby increasing the likelihood for dislocation. By flattening the surface that the stacks are deposited on, the strain between layers can be further increased through the addition of greater amounts of In or Sb in the active region. This increased In or Sb generally decreases the band gap energy, thereby making it easier to grow VCSELs 201 that emit longer wavelengths.

Quantum well depth can be an important consideration in achieving optimal gain from VCSEL quantum wells. Comprehensive, up-to-date compilations of band parameters useful for the development of semiconductor devices, such as VCSELS, are generally discussed in a paper entitled "Band parameters for III-V compound semiconductors and their alloys," by Vurgraftman, Meyer and Ram-Mohan (Journal of Applied Physics, Volume 89, Number 11, Jun. 1, 2001). The paper provides some insight for the skilled in the art on calculating band offsets, thereby enabling the achievement of optimal quantum well depth utilizing various materials, and is hereby incorporated by reference into the present disclosure for its teaching.

Quantum wells for VCSELs should be designed in order to promote confinement of carriers within the quantum wells instead of outside of the quantum wells, while at the same time not being so deep as to prohibit adequate flow of carriers between the wells. Proper quantum well depth will maximize the gain in the quantum wells of a VCSEL, which minimizes the threshold current and maximizes slope efficiency (both desirable outcomes). Luminescence and gain within a quantum well is related to the product of holes and electrons within the quantum well. Quantum well depth is established by setting band offsets. Two bands used to determine the quantum well depth are the valence and conduction bands (the valence band associated with hole wells and the conduction band with electron wells). Setting of the bands determines the offsets (meV, mili electron volts) for the quantum well and provides depth associated with the confinement of holes and electrons.

FIGS. 14-22 provide graphical illustrations of VCSEL behavior at different well depths. Although the simulations illustrated in FIGS. 14-22 were conducted on AlGaAs quantum wells, the overall analysis is applicable to other materials since temperature will generally be the same and effective masses are not vastly different between devices.

Figure 14:
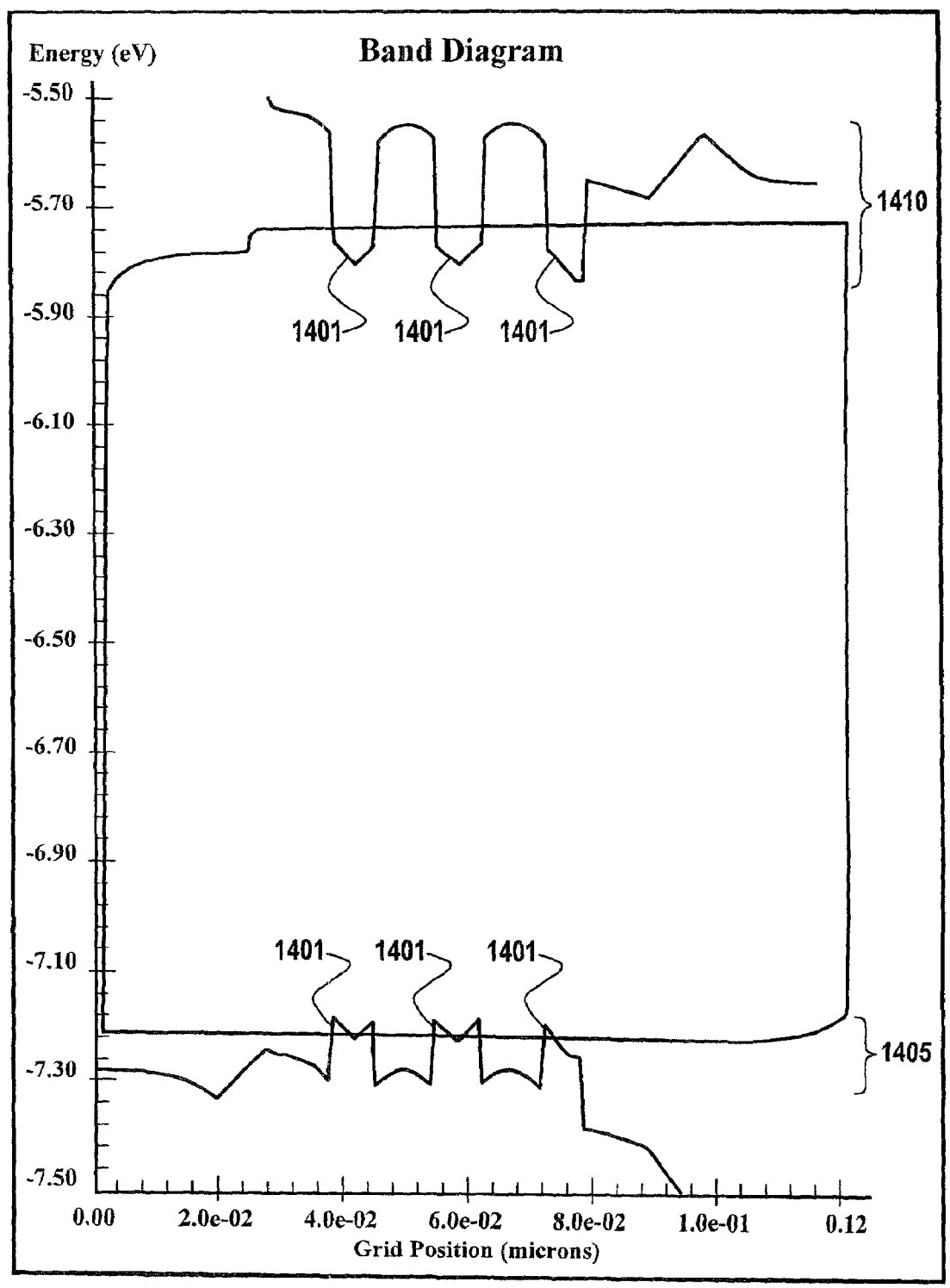
FIG. 14 is a graphical illustration of "energy v. position" for a VCSEL having three quantum wells with depths of ~125 meV for valence bands and ~250 meV for conduction bands.
Figure 15:
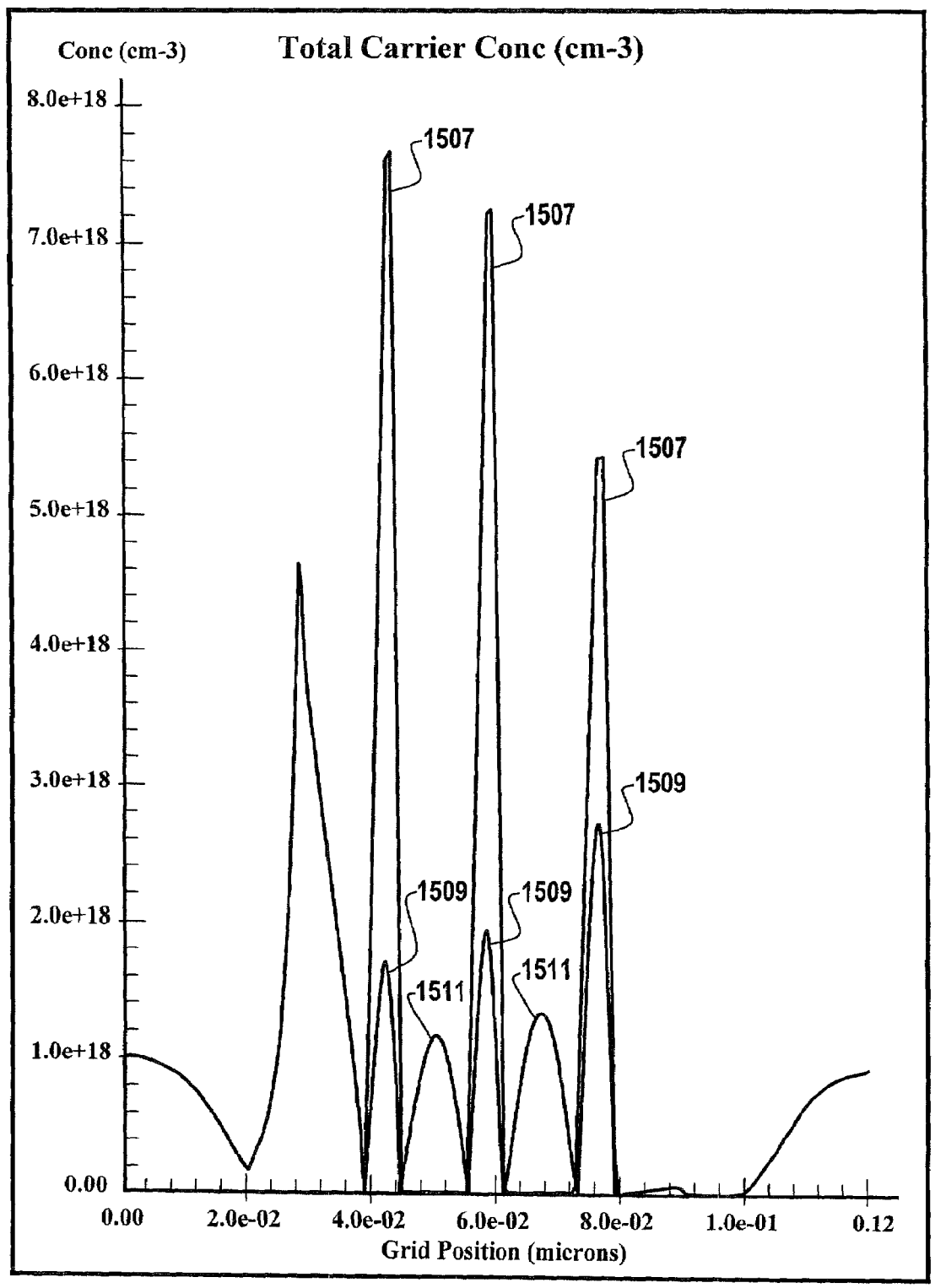
FIG. 15 is a graphical illustration of "energy v. position" for the VCSEL of FIG. 14 wherein recombination within the quantum wells is shown.
Figure 16:
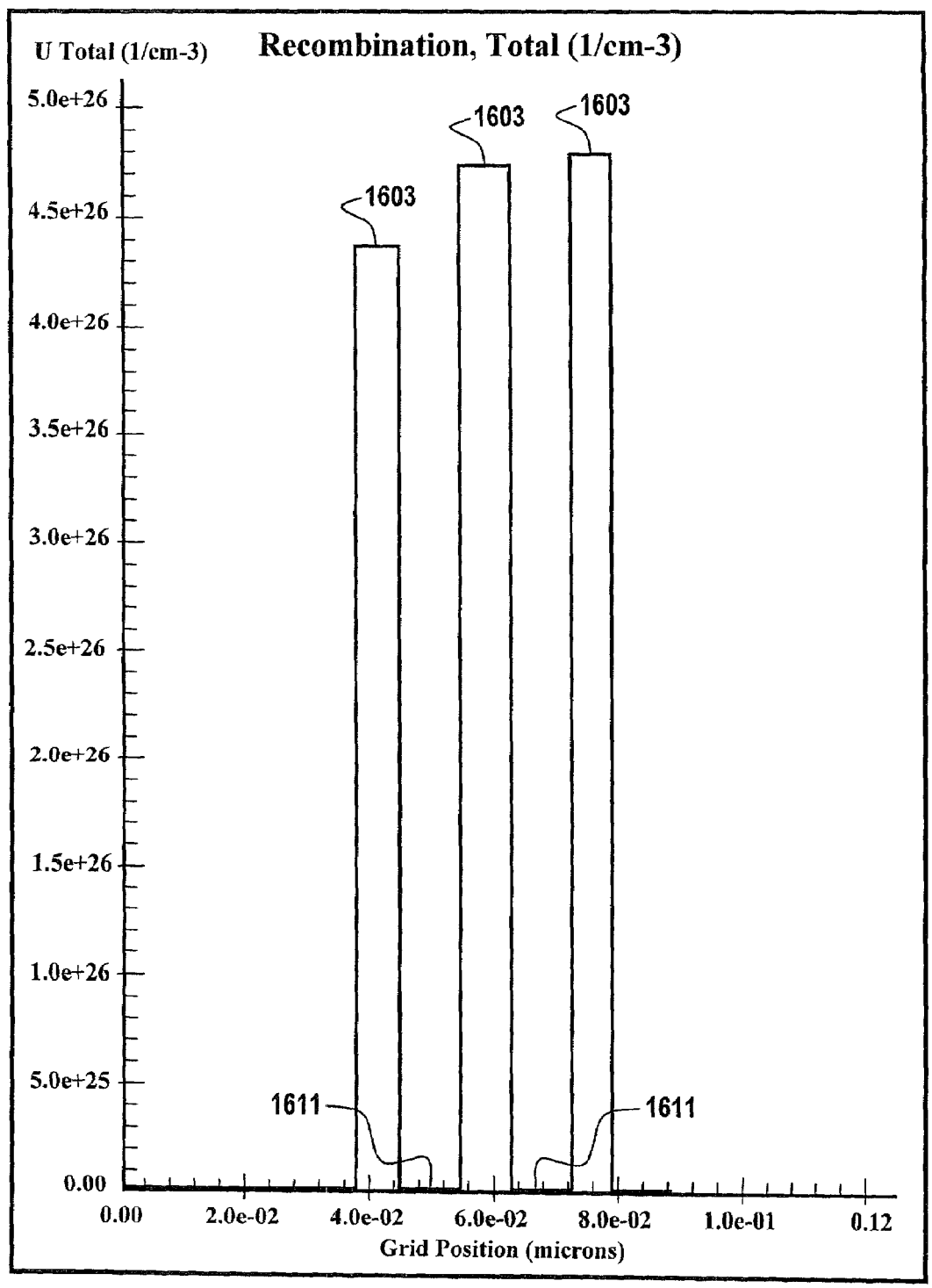
FIG. 16 is a graphical illustration of "energy v. position" for the VCSEL of FIG. 14 wherein total power within the quantum wells is shown.

FIGS. 14-16 are a first group of graphs representing the analysis of a normal set of three quantum wells 1401 for an 850 nm VCSEL under bias (actively lasing). In this case there is substantial p-doping, which suppresses the electron concentration relative to the hole concentration. As shown on the vertical axis of the graph in FIG. 14, well depth of three quantum wells 1401 was established by setting the valence band offsets 1405 at approximately 125 meV and the conduction band offset 1410 at 250 meV. It should be appreciated that the quantum well number does not have to be limited to three. As can be seen within the graphical data in FIG. 15, there is little recombination outside the three quantum wells shown. This can be seen where more electrons 1507 and holes 1509 are found recombining within the quantum wells than the area outside (or in-between) the quantum wells where some holes 1511 and minimal electrons exist. Although enough of both carriers are present, thus enabling sufficient transport between the wells. Referring to FIG. 16, the total recombination 1603 of holes with electrons occurring within the wells, rather than outside the wells 1611, results in good luminescence and thus good gain for the VCSEL quantum wells.

Figure 17:
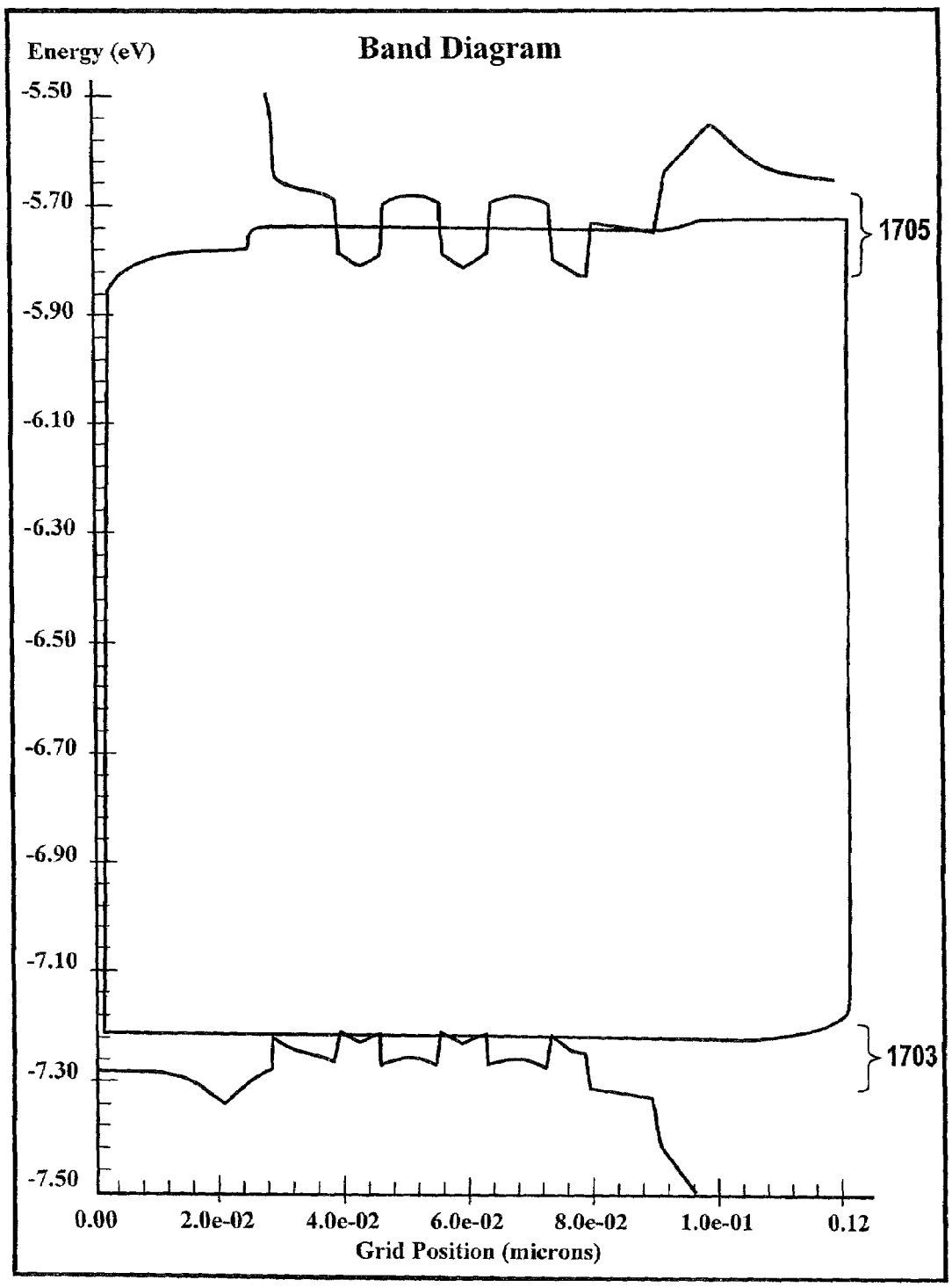
FIG. 17 is a graphical illustration of "energy v. position" for a VCSEL having three quantum wells with depths of ~60 meV for valence bands and ~120 meV for conduction bands.
Figure 18:
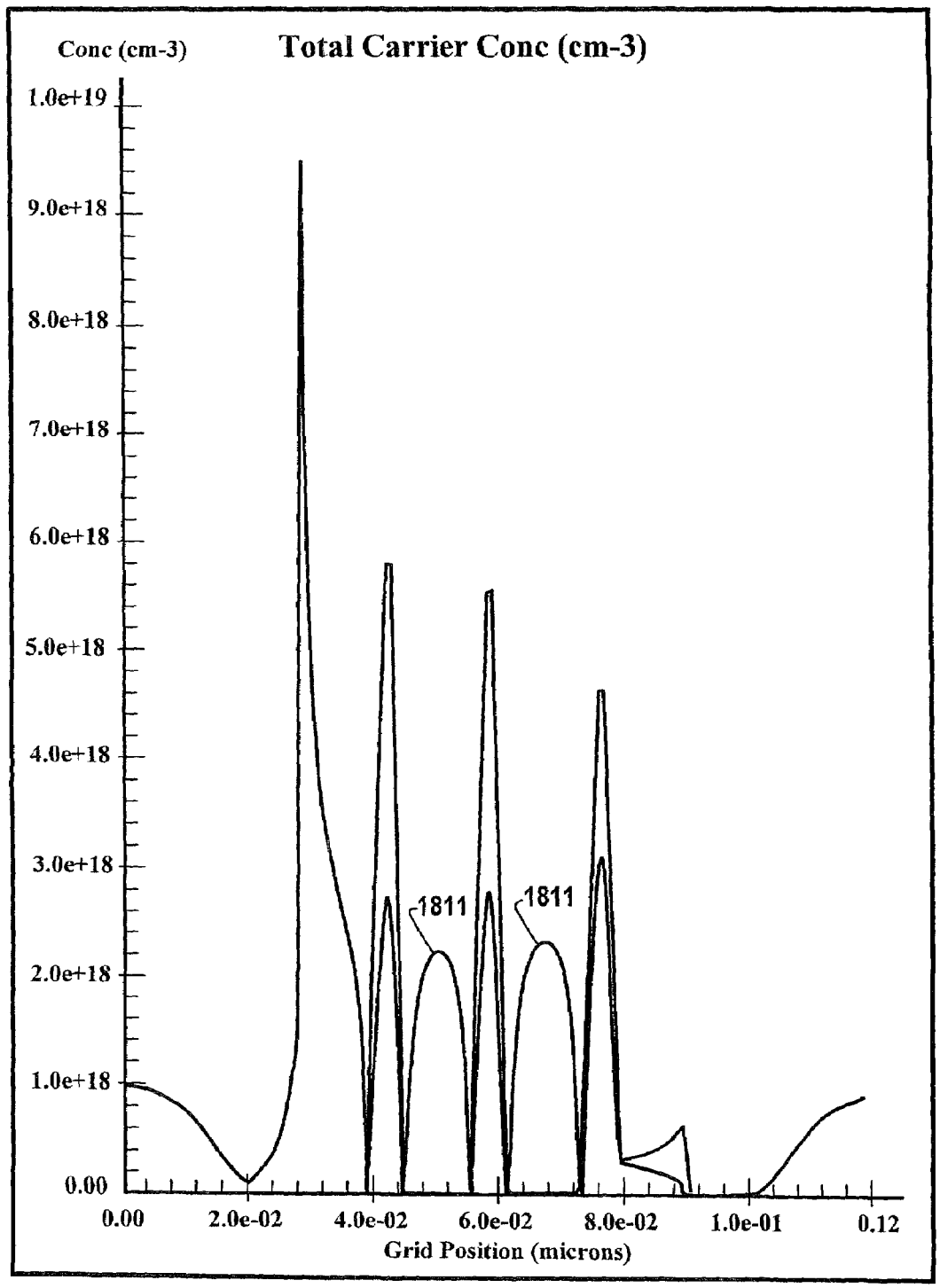
FIG. 18 is a graphical illustration of "energy v. position" for the VCSEL of FIG. 17 wherein recombination within the quantum wells is shown.
Figure 19:
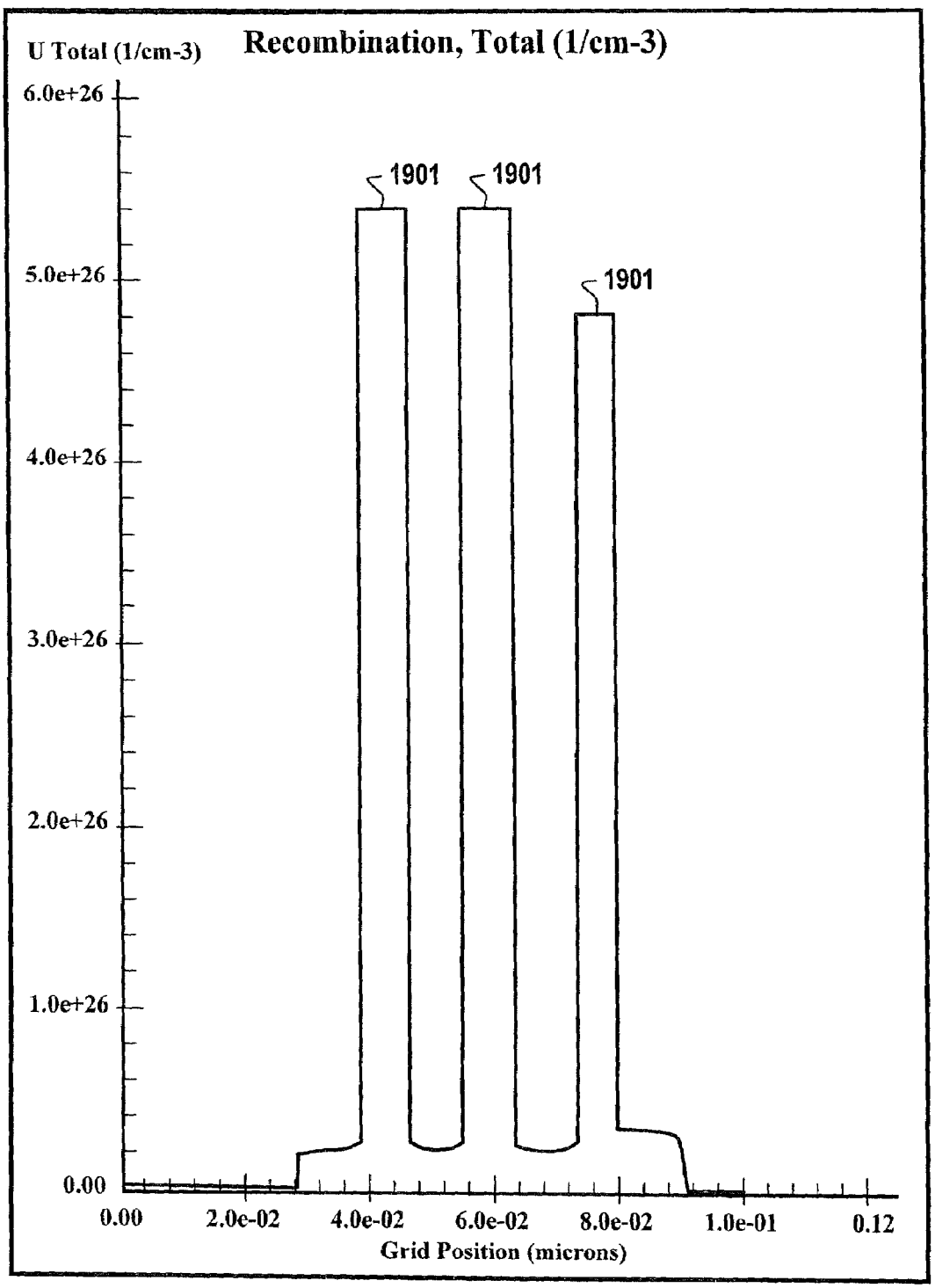
FIG. 19 is a graphical illustration of "energy v. position" for the VCSEL of FIG. 17 wherein total power within the quantum wells is shown.

FIGS. 17-19 illustrate a second group of graphs representing the analysis of quantum wells under bias. Referring to FIG. 17, quantum well depths were set at approximately 60 meV for valence bands 1703 and 120 meV for conduction bands 1705. Referring to FIG. 18, there is shown an increasing number of holes and electrons 1811 outside the three quantum wells. Such loss of holes and electrons outside of the quantum wells results in less luminescence 1901 and, therefore, less gain resulting from the quantum wells as shown in FIG. 19

Figure 20:
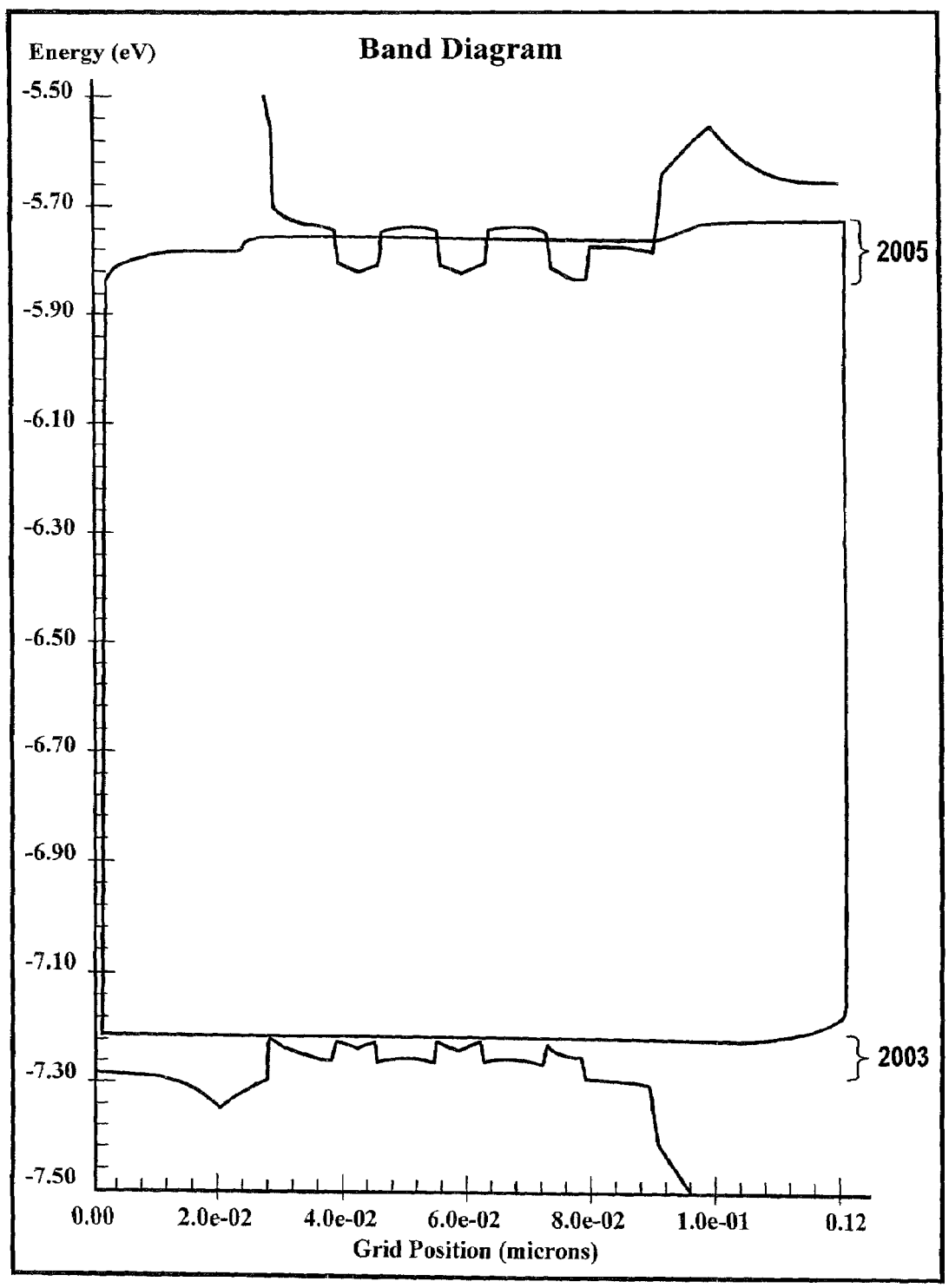
FIG. 20 is a graphical illustration of "energy v. position" for a VCSEL having three quantum wells with depths of ~40 meV for valence bands and ~80 meV for conduction bands.
Figure 21:
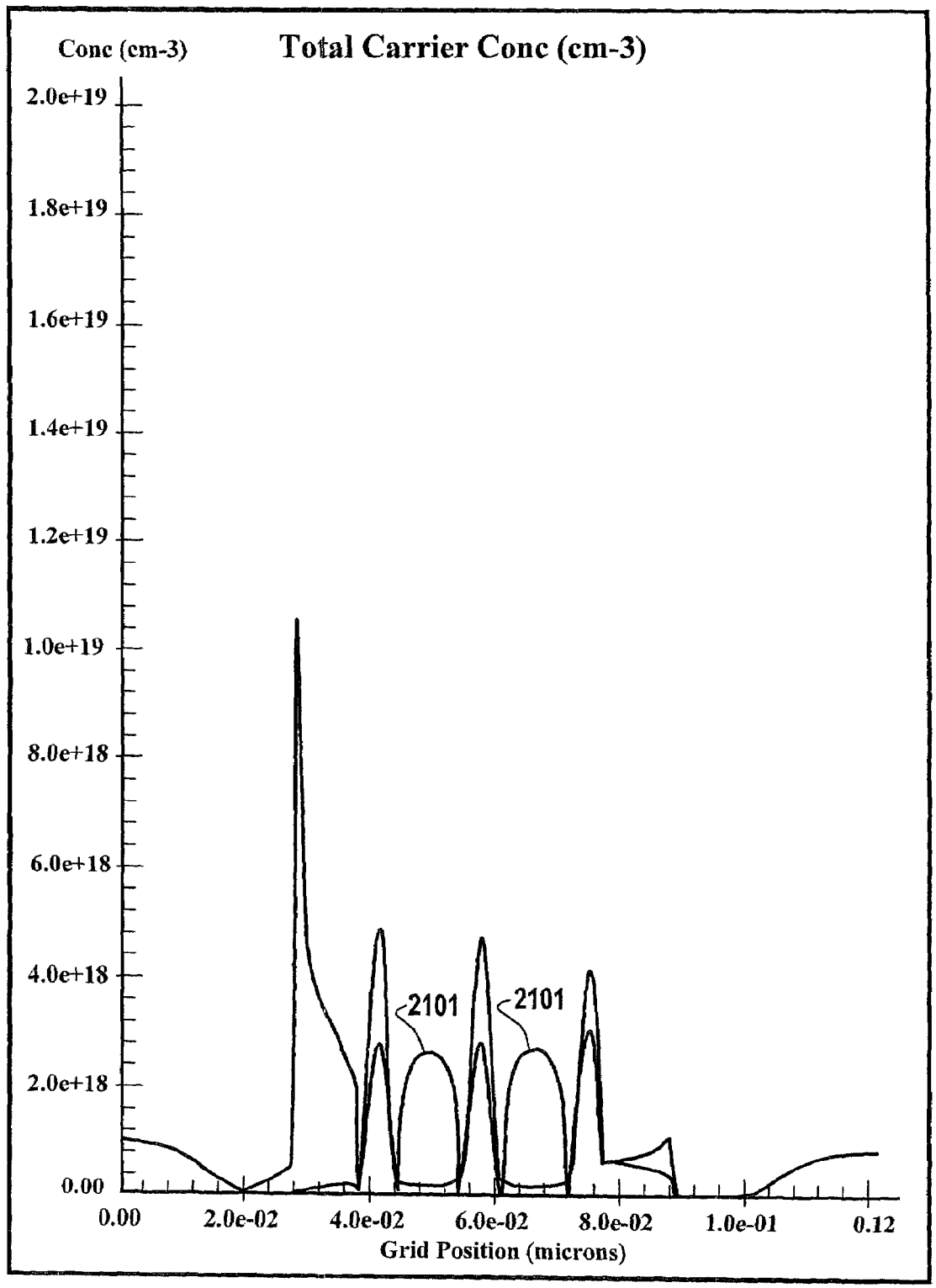
FIG. 21 is a graphical illustration of "energy v. position" for the VCSEL of FIG. 21 wherein recombination within the quantum wells is shown.
Figure 22:
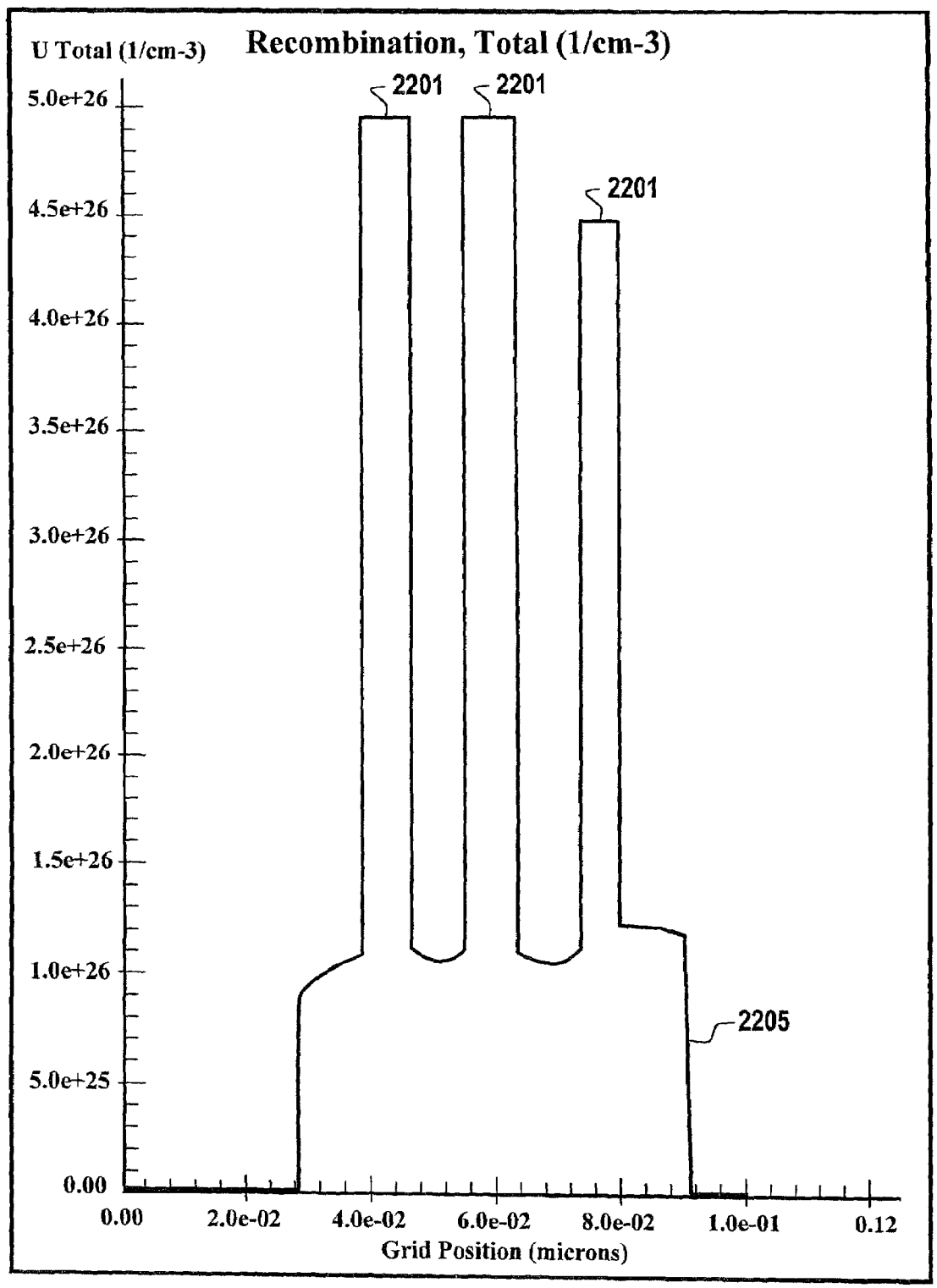
FIG. 22 is a graphical illustration of "energy v. position" for the VCSEL of FIG. 21 wherein total power within the quantum wells is shown.

FIGS. 20-22 are a third group of graphs representing the analysis of quantum wells under bias. The well depths for the three quantum wells were set at approximately 40 meV for valence bands 2003 and 80 meV for conduction bands 2005. As can be seen in FIG. 21, recombination 2101 outside of the three quantum wells has become quite large. Referring to FIG. 22, loss of recombination within the quantum wells results in a significantly less luminescence 2201 and gain due to undesirable parasitic luminescence 2205.

Based on the foregoing analysis for the quantum wells represented in the three groups, it would be desirable to develop VCSELs having quantum wells hole depths of at least 40 MeV and electron depths of at least 80 MeV. Such a setting for the valence and conduction bands would provide at least minimally acceptable gain; however, optimal quantum well hole well depths have been shown to be up to and including 125 MeV for the Valence bands and conduction bands with a setting of up to and including 250 MeV. Well depths even greater may be acceptable, as long as sufficient transport between the wells is maintained by thermionic emission, tunneling, or both.

The embodiment and examples set forth herein are presented to best explain the present invention and its practical application and to thereby enable those skilled in the art to make and utilize the invention. Those skilled in the art, however, will recognize that the foregoing description and examples have been presented for the purpose of illustration and example only. Other variations and modifications of the present invention will be apparent to those of skill in the art, and it is the intent of the appended claims that such variations and modifications be covered. The description as set forth is not intended to be exhaustive or to limit the scope of the invention. Many modifications and variations are possible in light of the above teaching without departing from the spirit and scope of the following claims. It is contemplated that the use of the present invention can involve components having different characteristics. It is intended that the scope of the present invention be defined by the claims appended hereto, giving full cognizance to equivalents in all respects.

What is claimed is:

1. A vertical cavity surface emitting laser (VCSEL), comprising:
    an active region further comprising at least one quantum well and including barrier layers sandwiching said at least one quantum well, at least one of the quantum well and the barrier layers including nitrogen, wherein said at least one quantum well is further comprised of Sb;
    upper and lower confinement layers sandwiching said active region, wherein the barrier layers and/or the upper and lower confinement layers are comprised of material that reduces a level of non-confining valence band discontinuity in the quantum well due to the presence of nitrogen in the quantum well, wherein said barrier layers are comprised of InGaAs and wherein said confinement layers are comprised of GaAsN; and
    a flattening layer interposed between the lower confinement layer and the at least one quantum well.

2. The VCSEL of claim 1 wherein said at least one quantum well is up to and including 50 Å in thickness.

3. The VCSEL of claim 1 wherein said at least one quantum well further comprises >1% N.

4. A vertical cavity surface emitting laser (VCSEL) comprising:
    an active region further comprising at least one quantum well comprised of InGaAsN and including InGaAsN barrier layers sandwiching said at least one quantum well; and
    AlGaAs confinement layers sandwiching said active regions.

5. The VCSEL of claim 4 wherein said at least one quantum well is further comprised of Sb.

6. The VCSEL of claim 4 wherein said at least one quantum well is up to and including 50 Å in thickness.

7. A vertical cavity surface emitting laser (VCSEL), comprising:
    an active region further comprising at least one quantum well comprised of InGaAsN and including AlGaAs barrier layers sandwiching said at least one quantum well; and
    AlGaAs confinement layers sandwiching said active region.

8. The VCSEL of claim 7 wherein said at least one quantum well is further comprised of Sb.

9. The VCSEL of claim 7 wherein said at least one quantum well is up to and including 50 Å in thickness.

10. The VCSEL of claim 7 wherein said AlGaAs barrier layers are further comprised of N.

11. A vertical cavity surface emitting laser (VCSEL), comprising:
    an active region further comprising at least one quantum well comprised of InGaAsN and including InGaAs barrier layers sandwiching said at least one quantum well; and
    AlGaAs confinement layers sandwiching said active region.

12. The VCSEL of claim 11 wherein said at least one quantum well is up to and including 50 Å in thickness.

13. The VCSEL of claim 11 wherein said at least one quantum well is further comprised of Sb.

14. A vertical cavity surface emitting laser (VCSEL), comprising:
    an active region further comprising at least one quantum well comprised of InGaAsN and including InGaAsN barrier layers sandwiching said at least one quantum well; and
    GaAsN confinement layers sandwiching said active regions.

15. The VCSEL of claim 14 wherein said at least one quantum well is further comprised of Sb.

16. The VCSEL of claim 14 wherein said at least one quantum well is up to and including 50 Å in thickness.

17. A vertical cavity surface emitting laser (VCSEL), comprising:
    an active region further comprising at least one quantum well comprised of InGaAsN and including AlGaAs barrier layers sandwiching said at least one quantum well; and
    GaAsN confinement layers sandwiching said active region.

18. The VCSEL of claim 17 wherein said at least one quantum well is further comprised of Sb.

19. The VCSEL of claim 17 wherein said at least one quantum well is up to and including 50 Å in thickness.

20. The VCSEL of claim 17 wherein said AlGaAs barrier layers are further comprised of N.

21. A vertical cavity surface emitting laser (VCSEL), comprising:
- an active region further comprising at least one quantum well and including barrier layers sandwiching said at least one quantum well, at least one of the quantum well and the barrier layers including nitrogen, wherein said at least one quantum well is further comprised of Sb;
- upper and lower confinement layers sandwiching said active region, wherein the barrier layers and/or the upper and lower confinement layers are comprised of material that reduces a level of non-confining valence band discontinuity in the quantum well due to the presence of nitrogen in the quantum well, wherein said confinement layers are comprised of AlGaAs; and
- a flattening layer interposed between the lower confinement layer and the at least one quantum well.

22. The VCSEL of claim 21 wherein said barrier layers are comprised of GaAsN.

23. The VCSEL of claim 21 wherein said at least one quantum well further comprises >1% N.

24. The VCSEL of claim 21 wherein said at least one quantum well is up to and including 50 Å in thickness.

25. The VCSEL of claim 23 wherein said at least one quantum well is up to and including 50 Å in thickness.

26. The VCSEL of claim 21 wherein said barrier layers are comprised of InGaAs.

* * * * *

UNITED STATES PATENT AND TRADEMARK OFFICE
CERTIFICATE OF CORRECTION

PATENT NO. : 7,408,964 B2  Page 1 of 1
APPLICATION NO. : 10/026019
DATED : August 5, 2008
INVENTOR(S) : Johnson It is certified that error appears in the above-identified patent and that said Letters Patent is hereby corrected as shown below:

On the Title Page
Item (56), Page 3, Right Hand Side, Line 10 change "layser" to --laser--
Item (56), Page 4, Left Hand Side, Line 4 change "mum" to --µm--
Item (56), Page 4, Left Hand Side, Line 23 change "distribut4ed" to --distributed--

Col. 12
Line 51 change "including InGaAsN" to --including GaAsN--

Signed and Sealed this

Fourteenth Day of September, 2010

David J. Kappos
*Director of the United States Patent and Trademark Office*